United States Patent
Kim et al.

(10) Patent No.: US 12,466,995 B2
(45) Date of Patent: Nov. 11, 2025

(54) SOLUBLE GRAPHENE QUANTUM DOTS AND LIGHT-EMITTING DEVICE USING THE SAME

(71) Applicant: Samsung Electronics Co., Ltd., Suwon-si (KR)

(72) Inventors: Sangwon Kim, Seoul (KR); Xinliang Feng, Dresden (DE); Fupeng Wu, Dresden (DE); Junzhi Liu, Dresden (DE); Klaus Muellen, Dresden (DE); Wenhui Niu, Dresden (DE); Hyeonjin Shin, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 882 days.

(21) Appl. No.: 17/720,518

(22) Filed: Apr. 14, 2022

(65) Prior Publication Data

US 2022/0333010 A1    Oct. 20, 2022

(30) Foreign Application Priority Data

Apr. 16, 2021    (KR) .......................... 10-2021-0050020

(51) Int. Cl.
| | | |
|---|---|---|
| C09K 11/65 | (2006.01) | |
| C01B 32/182 | (2017.01) | |
| C09K 11/02 | (2006.01) | |
| H10K 50/115 | (2023.01) | |
| B82Y 20/00 | (2011.01) | |
| B82Y 40/00 | (2011.01) | |

(Continued)

(52) U.S. Cl.
CPC ............ *C09K 11/65* (2013.01); *C01B 32/182* (2017.08); *B82Y 20/00* (2013.01); *B82Y 40/00* (2013.01); *C01P 2004/64* (2013.01); *C01P 2006/60* (2013.01); *H10K 50/115* (2023.02); *H10K 50/15* (2023.02); *H10K 50/16* (2023.02); *H10K 50/171* (2023.02); *H10K 2102/00* (2023.02)

(58) Field of Classification Search
CPC ......... C09K 11/65; C09K 11/06; C09K 11/02; C09K 11/025; H10K 50/115; H10K 50/11; H10K 50/15; H10K 50/16; H10K 50/171; H10K 2102/00; H10K 85/20; C01B 32/182; C01P 2006/60; B82Y 20/00

See application file for complete search history.

(56) References Cited

U.S. PATENT DOCUMENTS

2015/0280248 A1* 10/2015 Tour ..................... C01B 32/198
                                                                502/180
2021/0300845 A1    9/2021 Kim et al.

FOREIGN PATENT DOCUMENTS

| KR | 2012/0114464 A | 10/2012 |
| KR | 101632721 B1 | 6/2016 |
| KR | 2019/0085414 A | 7/2019 |

OTHER PUBLICATIONS

Machine translation of KR20190085414A, 20 pages (Year: 2019).*

(Continued)

*Primary Examiner* — Matthew E. Hoban
*Assistant Examiner* — Lynne Edmondson
(74) *Attorney, Agent, or Firm* — HARNESS, DICKEY & PIERCE, P.L.C.

(57) ABSTRACT

Provided are soluble graphene quantum dots and light-emitting devices including the same. The soluble graphene quantum dot has an anthracenyl N-alkyl maleimide functional group at an edge thereof, thereby exhibiting improved solubility and/or improved emission characteristics.

16 Claims, 7 Drawing Sheets

(51) Int. Cl.
　　　 H10K 50/15　　　(2023.01)
　　　 H10K 50/16　　　(2023.01)
　　　 H10K 50/17　　　(2023.01)
　　　 H10K 102/00　　(2023.01)

(56) References Cited

OTHER PUBLICATIONS

Korean Office Action dated Dec. 13, 2024 for corresponding Korean Patent Application No. 10-2021-0050020 and its English-language translation.
Gao Xue et al., "Application of maleimide modified graphene quantum dots and porphyrin fluorescence resonance energy transfer in the design of "turn-on" fluorescence sensors for biothiols", Analytica Chimica Acta 1108, 46-53. (2020).
John A. McGuire, "Growth and optical properties of colloidal graphene quantum dots", Phys. Status Solidi RRL 10, No. 1, 91-101. (2016).
Mamta Thakran et al., "Amplified adsorption and photocatalytic degradation of polycyclic aromatic hydrocarbons using biocompatible nanocrystalline reduced graphene oxide quantum dots", Journal of Photochemistry & Photobiology, A: Chemistry 456, 115798. (2024).
Yinjuan Huang et al., 'Intrinsic Properties of Single Graphene Nanoribbons in Solution: Synthetic and Spectroscopic Studies' *Journal of the American Chemistry Society*, vol. 140(33), Aug. 2018, pp. 10416-10420.
Zhenyu Liu et al., 'Highly sensitive fluorescence sensor for mercury(II) based on boron- and nitrogen-co-doped graphene quantum dots' *Journal of Colloid and Interface Science*, vol. 566, 2020, pp. 357-368.
Hiroyuki Tetsuka et al., 'Optically Tunable Amino-Functionalized Graphene Quantum Dots' *Advanced Materials*, vol. 24, 2012, pp. 5333-5338.
Woosung Kwon et al., 'Electroluminescence from Graphene Quantum Dots Prepared by Amidative Cutting of Tattered Graphite' *Nano Letters*, vol. 14, No. 3, 2014, pp. 1306-1311.
Fanglong Yuan et al., 'Bright high-colour-purity deep-blue carbon dot light-emitting diodes via efficient edge amination' *Nature Photonics*, vol. 14, 2020, pp. 171-176.
Yuan-Zhi Tan et al., 'Atomically precise edge chlorination of nanographenes and its application in graphene nanoribbons' *Nature Communications*, vol. 4, Article 2646, Nov. 2013.

* cited by examiner

SOLUBLE GRAPHENE QUANTUM DOTS AND LIGHT-EMITTING DEVICE USING THE SAME

CROSS-REFERENCE TO RELATED APPLICATION

This application is based on and claims priority under 35 U.S.C. § 119 to Korean Patent Application No. 10-2021-0050020, filed on Apr. 16, 2021 in the Korean Intellectual Property Office, the disclosure of which is incorporated by reference herein in its entirety.

BACKGROUND

1. Field

The present disclosure relates to soluble graphene quantum dots and light-emitting devices including the same.

2. Description of the Related Art

An organic light-emitting device is a self-luminous device that, as compared to devices of the related art, has a wide viewing angle, excellent contrast, a fast response time, and excellent luminance, drive voltage and response speed characteristics, and can be multicolored.

According to an example, an organic light-emitting device may include an anode, a cathode, and an organic layer interposed between the anode and the cathode and including an emission layer. A hole transport region may be provided between the anode and the emission layer, and an electron transport region may be provided between the emission layer and the cathode. Holes injected from the anode move to the emission layer via the hole transport region, and electrons injected from the cathode move to the emission layer via the electron transport region. Carriers such as holes and electrons recombine in the emission region to generate excitons. Light is generated as these excitons change from an excited state to a ground state.

As light-emitting materials, research on high-efficiency and long-life organic light-emitting materials is continuously being carried out.

SUMMARY

Provided are soluble graphene quantum dots and light-emitting devices including the same.

Additional aspects will be set forth in part in the description which follows and, in part, will be apparent from the description, or may be learned by practice of the presented embodiments of the disclosure.

According to an aspect of an embodiment, a soluble graphene quantum dot includes an anthracenyl N-alkyl maleimide functional group at an edge thereof.

According to an aspect of another embodiment, a light-emitting device includes the at least one soluble graphene quantum dot.

According to an aspect of another embodiment, an organic light-emitting device includes a first electrode, a second electrode, and an organic layer including an emission layer between the first electrode and the second electrode, wherein the organic layer includes the at least one soluble graphene quantum dot.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
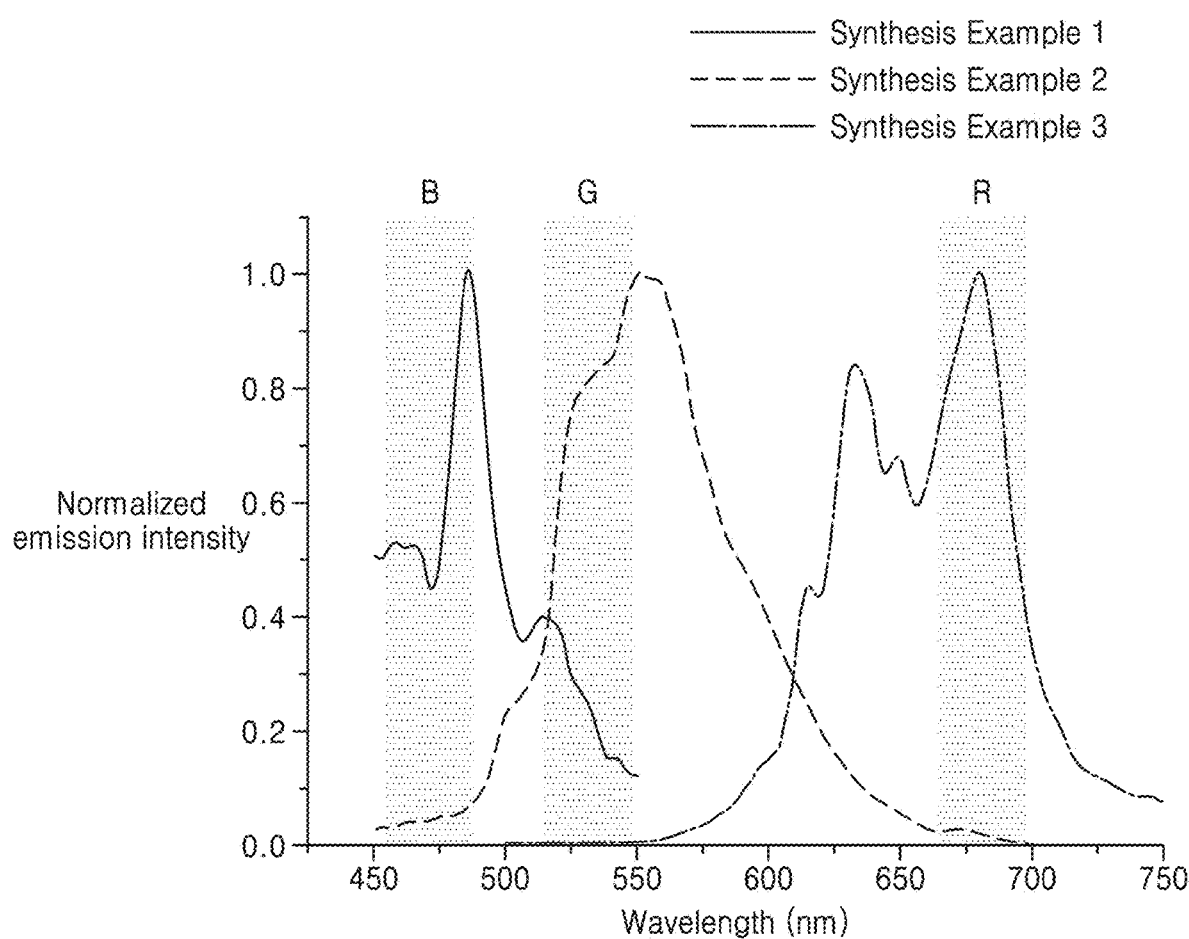
FIG. 1 is a graph illustrating the photoluminescence spectra for each wavelength of the luminescent solutions of Examples 1, 3, and 4.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The present inventive concept will now be described more fully with reference to the accompanying drawings, in which example embodiments are illustrated. However, the present inventive concept may be embodied in many different forms, should not be construed as being limited to the embodiments set forth herein, and should be construed as including all modifications, equivalents, and alternatives within the scope of the present inventive concept.

The terms used herein is for the purpose of describing particular embodiments only and is not intended to be limiting of the inventive concept. Singular expressions include plural expressions unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the drawings, the thickness is enlarged or reduced in order to clearly express various layers and regions. Throughout the specification, the same reference numerals are attached to similar parts Throughout the specification, when an element such as a layer, a film, a region or a component is referred to as being "on" another layer or element, it can be "directly on" the other layer or element, or intervening layers, regions, or components may also be present. Although the terms "first", "second", "third", etc., may be used herein to describe various elements, components, regions, and/or layers, these elements, components, regions, and/or layers should not be limited by these terms. These terms are used only to distinguish one component from another, not for purposes of limitation.

Although the terms "first, second, and the like" may be used to describe various elements, components, areas, layers and/or regions, it will be understood that such elements, components, areas, layers and/or regions should not be limited by these terms.

In addition, processes to be described in the present disclosure do not necessarily mean that they are applied in order. For example, in the case where a first step and a second step are described, it will be understood that the first step does not necessarily have to be performed before the second step.

Hereinafter, soluble graphene quantum dots according to embodiments and light-emitting devices employing the same will be described in more detail.

A soluble graphene quantum dot according to an embodiment includes an anthracenyl N-alkyl maleimide functional group at an edge thereof.

The soluble graphene quantum dot having an anthracenyl N-alkyl maleimide functional group at the edge thereof is soluble in a solvent, and may realize various colors in an RGB region depending on the size of the graphene quantum dot, and may exhibit excellent emission characteristics.

According to an embodiment, in the anthracenyl N-alkyl maleimide functional group, a substituted or unsubstituted alkyl group of 1 to 20 carbon atoms may be bonded to N.

According to an embodiment, the anthracenyl N-alkyl maleimide functional group is represented by the following Formula.

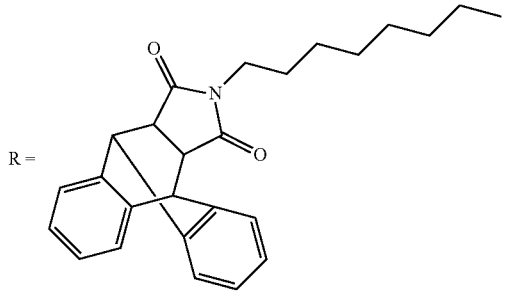 [SMILES: CCCCCCCCN1C(=O)C2C3c4ccccc4C(c4ccccc43)C2C1=O]

According to an embodiment, in the anthracenyl N-alkyl maleimide functional group, at least one hydrogen atom may be each independently substituted with —F (fluoro group), an unsubstituted $C_1$-$C_{10}$ alkyl group, an unsubstituted $C_6$-$C_{10}$ aryl group, a fluoro group-substituted $C_1$-$C_{10}$ alkyl group, or a fluoro group-substituted $C_6$-$C_{10}$ aryl group.

According to an embodiment, the graphene quantum dot may have a graphene core plane having a carbon number of 24 to 300 and a width-length ratio of less than about 1:3.

According to an embodiment, the graphene quantum dot may have at least one of graphene core planes having carbon numbers of 42, 48, 60, 72, 96, 132 and 222.

According to an embodiment, the graphene quantum dot may be represented by at least one of Formulas 1 to 8:

<Formula 1>

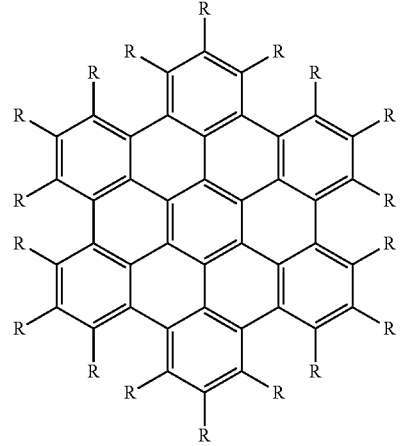

<Formula 2>

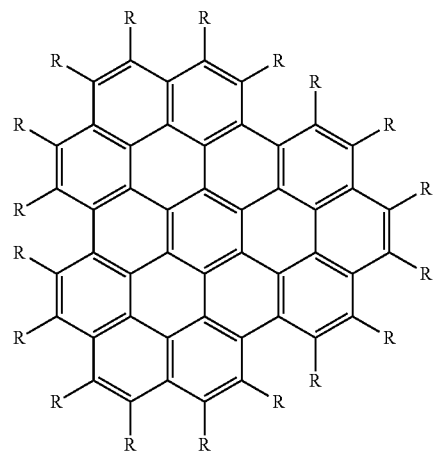

<Formula 3>

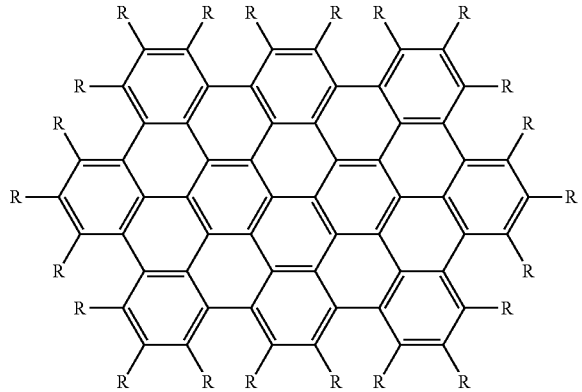

<Formula 4>
<Formula 5>
<Formula 6>
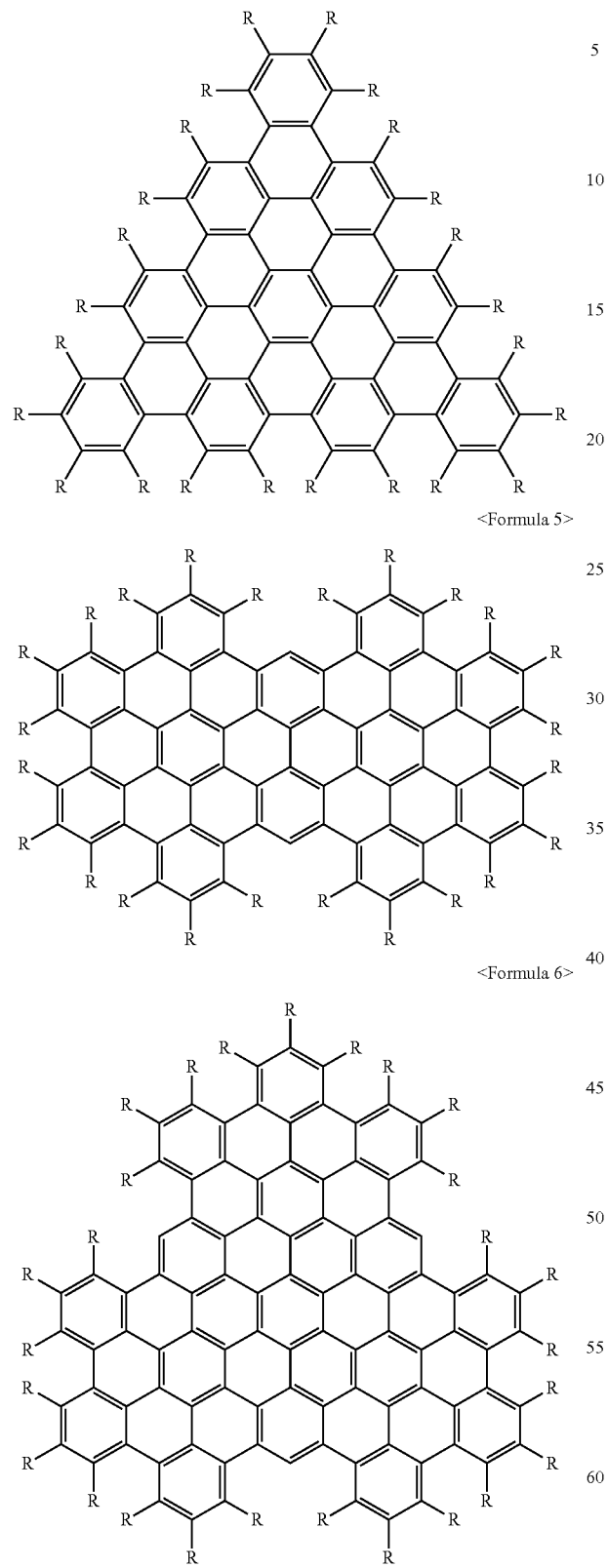
<Formula 7>
<Formula 8>
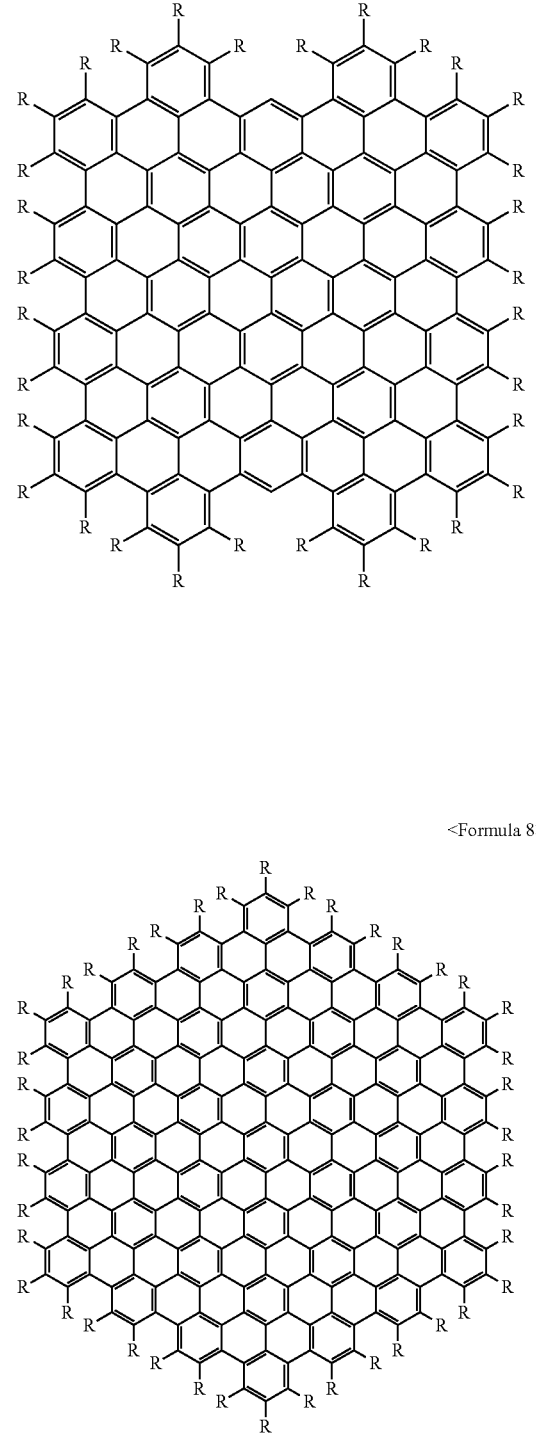
In Formulas 1 to 8, at least one of Rs is anthracenyl N-alkyl maleimide functional group, and others thereof are hydrogen atoms.
According to an embodiment, the graphene quantum dot may be represented by at least one of Formulas 1a, 4a, 5a and 6a:

<Formula 1a>

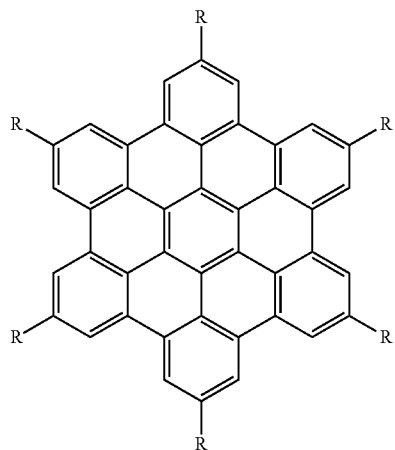

<Formula 4a>

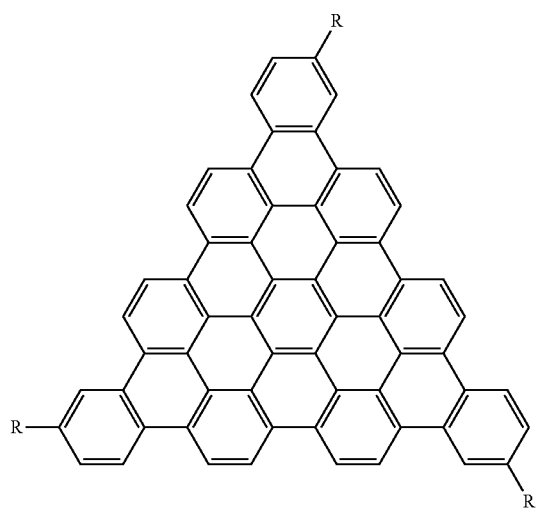

<Formula 5a>

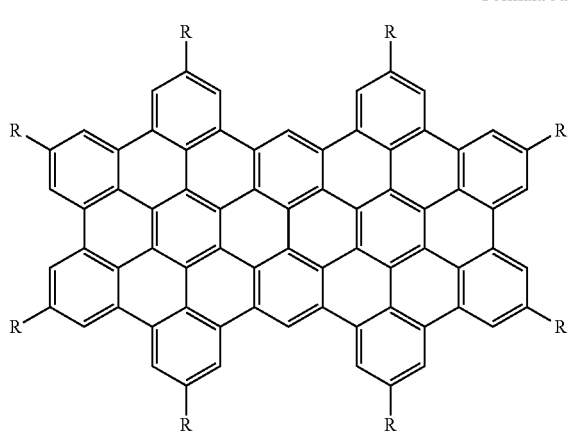

<Formula 6a>

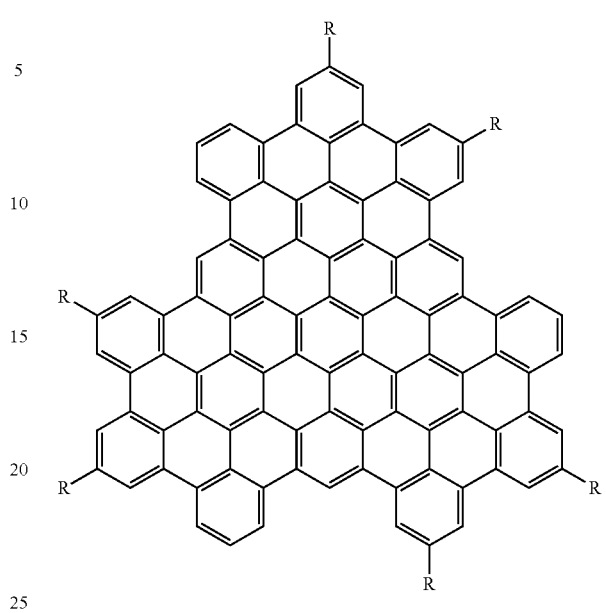

wherein, in Formulas 1a, 4a, 5a and 6a, each R is an anthracenyl N-alkyl maleimide functional group.

Each R may be represented by the following Formula:

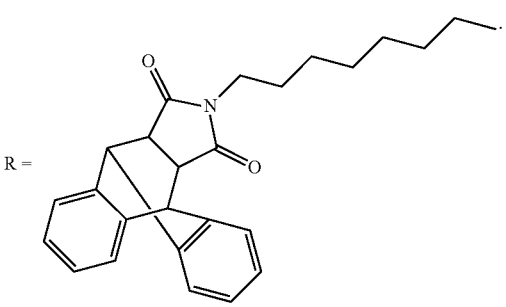 [SMILES: CCCCCCCCN1C(=O)C2C3c4ccccc4C(c4ccccc43)C2C1=O]

The soluble graphene quantum dot may exhibit excellent emission characteristics even in a solution phase due to improved solubility.

A light-emitting material according to an embodiment may include the at least one soluble graphene quantum dot.

The light-emitting material may be provided in a solid state or a solution state.

The light-emitting material may obtain light in various wavelength bands by adjusting the core size of the soluble graphene quantum dot, and as the core size thereof increases, an emission wavelength band moves in a red direction. The light-emitting material may exhibit emission characteristics in R (red), G (green), and B (blue) regions according to the core size of the soluble graphene quantum dot.

The light-emitting material including the soluble graphene quantum dots may be employed in various light-emitting devices such as organic light-emitting devices and light-emitting transistor devices.

According to an embodiment, the soluble graphene quantum dot may be suitable for use as a host of an organic layer of an organic light-emitting device, for example, an emission layer of the organic layer. Accordingly, the soluble graphene quantum dot may have a high efficiency and/or a long lifetime.

According to an embodiment, there is provided an organic light-emitting device including: a first electrode; a second electrode; and an organic layer including an emission layer between the first electrode and the second electrode, wherein the organic layer includes the aforementioned soluble graphene quantum dot.

The organic light-emitting device may have a high efficiency and a long lifetime by having an organic layer including the aforementioned soluble graphene quantum dot.

The soluble graphene quantum dot may be used between a pair of electrodes of the organic light-emitting device. For example, the soluble graphene quantum dot may be included in at least one of an emission layer, a hole transport region (for example, a region including at least one of a hole injection layer, a hole transport layer, and an electron blocking layer) interposed between the first electrode and the emission layer, and an electron transport region (for example, a region including at least one of a hole blocking layer, an electron transport layer, and an electron injection layer) interposed between the emission layer and the second electrode. For example, the soluble graphene quantum dots may be included in the emission layer. In this case, the emission layer may further include a dopant, and the soluble graphene quantum dots included in the emission layer may serve as a host. The emission layer may be a green emission layer emitting green light, and the dopant may be a phosphorescent dopant.

As used herein, "(organic layer) includes one or more soluble graphene quantum dots" may be interpreted that "(organic layer) may include one type of soluble graphene quantum dots belonging to the category of Formula 1 or two or more different types of graphene quantum dots belonging to the category of Formula 1".

For example, the organic layer may include only one type of Compound 1 as the soluble graphene quantum dots. In this case, Compound 1 may be included in the emission layer of the organic light-emitting device. Alternatively, the organic layer may include two or more types of Compounds 1 as the soluble graphene quantum dots. In this case, at least one compound 1 may be present in the same layer (for example, Compound 1 may all be present in the emission layer) or may be present in different layers.

For example, the first electrode may be an anode, the second electrode may be a cathode, and the organic layer may include i) a hole transport region interposed between the first electrode and the emission layer and including at least one of a hole injection layer, a hole transport layer, and an electron blocking layer, and ii) an electron transport region interposed between the emission layer and the second electrode and including at least one of a hole blocking layer, an electron transport layer, and an electron injection layer.

As used herein, the term "organic layer" refers to a single and/or a plurality of layers interposed between the first electrode and the second electrode of the organic light-emitting device. The "organic layer" may include not only an organic compound, but also an organometallic complex including a metal.

Figure 7:
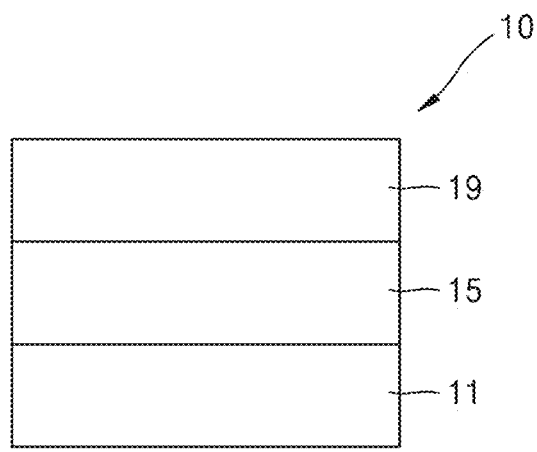
FIG. 7 is a cross-sectional view schematically illustrating an organic light-emitting device according to an embodiment.

FIG. 7 is a cross-sectional view schematically illustrating an organic light-emitting device 10 according to an embodiment. Hereinafter, a structure of an organic light-emitting device according to an embodiment and a method of manufacturing an organic light-emitting device according to an embodiment will be described with reference to FIG. 7. The organic light-emitting device 10 has a structure in which a first electrode 11, an organic layer 15, and a second electrode 19 are sequentially stacked.

A substrate may be additionally disposed under the first electrode 11 or on the second electrode 19. As the substrate, a substrate used in an organic light-emitting device in the art may be used, and a glass substrate or a transparent plastic substrate excellent in mechanical strength, thermal stability, transparency, surface smoothness, handling easiness and waterproofness may be used.

The first electrode 11 may be formed by, for example, providing a material for the first electrode on a substrate using a deposition method or a sputtering method. The first electrode 11 may be an anode. The material for the first electrode may be selected from materials having a high work function to facilitate hole injection. The first electrode 11 may be a reflective electrode, a semi-transmissive electrode, or a transmissive electrode. As the material for the first electrode 11, indium tin oxide (ITO), indium zinc oxide (IZO), tin oxide ($SnO_2$), zinc oxide (ZnO), or the like may be used. Alternatively, a metal such as magnesium (Mg), aluminum (Al), aluminum-lithium (Al—Li), calcium (Ca), magnesium-indium (Mg—In), or magnesium-silver (Mg—Ag) may be used.

The first electrode 11 may have a single layer structure or a multilayer structure including two or more layers.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include at least one of a hole injection layer, a hole transport layer, an electron blocking layer, and a buffer layer.

The hole transport region may include only a hole injection layer or only a hole transport layer. Alternatively, the hole transport region may have a structure in which a hole injection layer/hole transport layer or a hole injection layer/hole transport layer/electron blocking layer are sequentially stacked from the first electrode 11.

When the hole transport region includes the hole injection layer (HIL), the hole injection layer (HIL) may be formed on the first electrode 11 by using various methods such as vacuum deposition, spin coating, casting, and LB.

When the hole injection layer is formed by vacuum deposition, the deposition conditions thereof vary depending on a compound used as a material for the hole injection layer, the target structure and thermal characteristics of the hole injection layer, and the like. For example, deposition temperature may be selected from about 100° C. to about 500° C., vacuum degree may be selected from about $10^{-8}$ torr to about $10^{-3}$ torr, and a deposition rate may be selected from about 0.01 Å/sec to about 100 Å/sec, but the present disclosure is not limited thereto.

When the hole injection layer is formed by spin coating, the coating conditions thereof vary depending on a compound used as a material for the hole injection layer and the target structure and thermal characteristics of the hole injection layer. For example, a coating speed may be selected from about 2000 rpm to about 5000 rpm and heat treatment temperature for removing a solvent after coating may be selected from about 80° C. to 200° C., but the present disclosure is not limited thereto.

For the conditions for forming the hole transport layer and the electron blocking layer, refer to the conditions for forming the hole injection layer.

The hole transport region may include at least one of m-MTDATA, TDATA, 2-TNATA, NPB, β-NPB, TPD, Spiro-TPD, Spiro-NPB, α-NPB, TAPC, HMTPD, TCTA (4,4',4''-tris(N-carbazolyl)triphenylamine (4,4',4''-tris(N- carbazolyl)triphenylamine)), Pani/DBSA (polyaniline/dodecylbenzenesulfonic acid), PEDOT/PSS(poly(3,4-ethylenedioxythiophene)/poly(4-styrenesulfonate)), Pani/CSA (polyaniline/camphor sulfonic acid), PANI/PSS (polyaniline)/poly(4-styrenesulfonate)), a compound represented by Chemical Formula 8 below, and a compound represented by Chemical Formula 9 below.

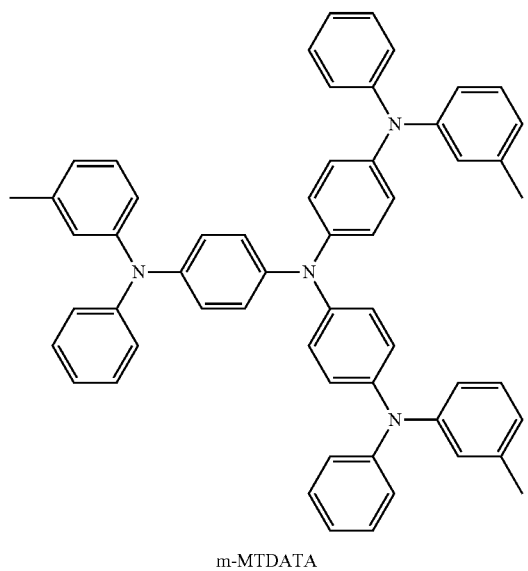

m-MTDATA

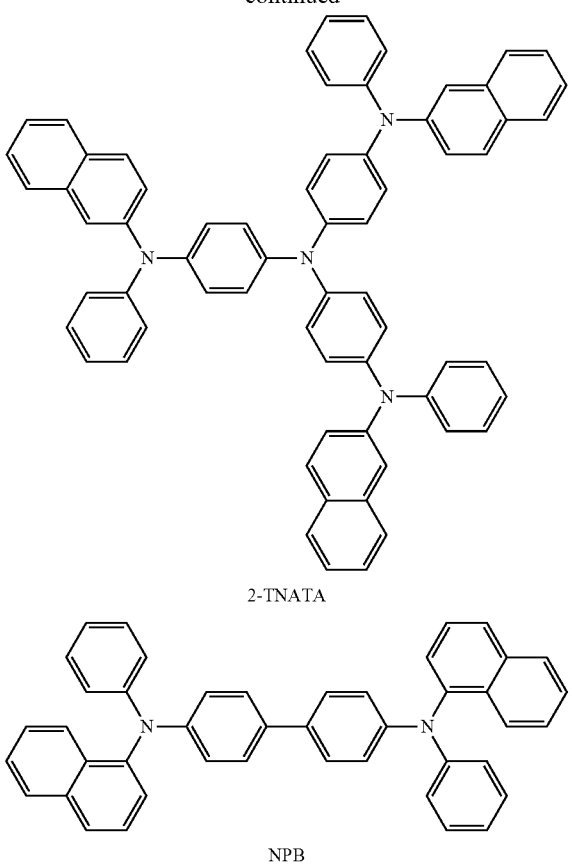

2-TNATA

NPB

β-NPB

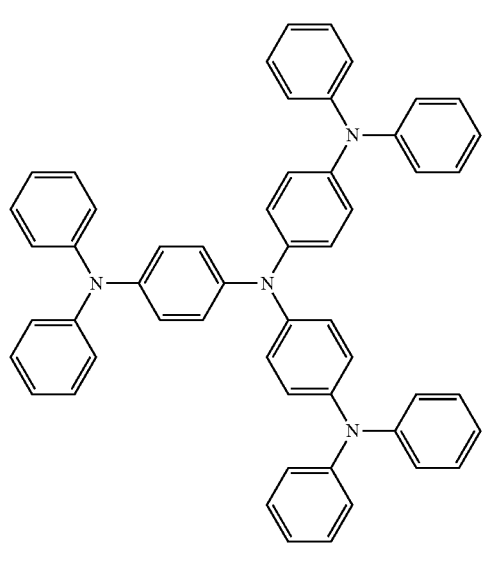

TDATA

TPD

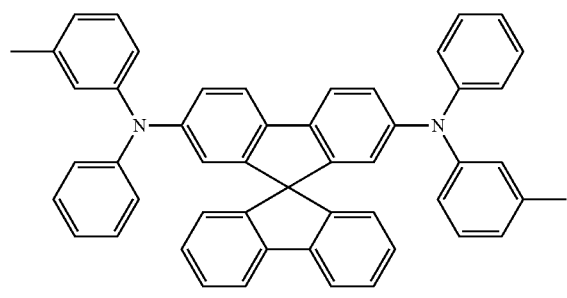

Spiro-TPD

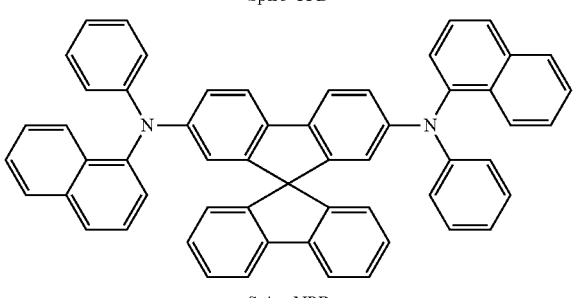

Spiro-NPB

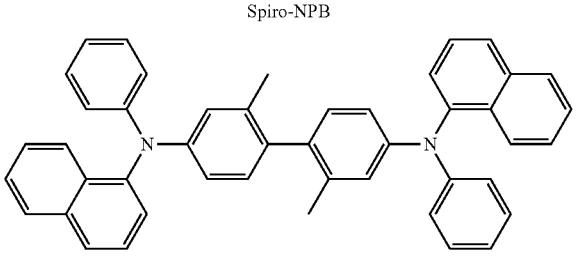

α-NPB

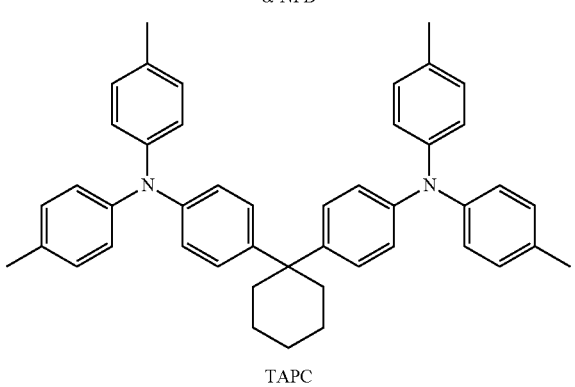

TAPC

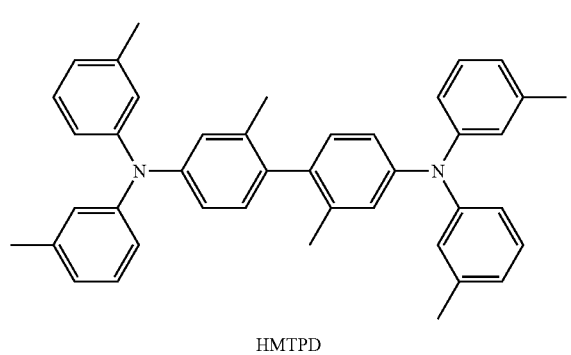

HMTPD

<Chemical Formula 8>

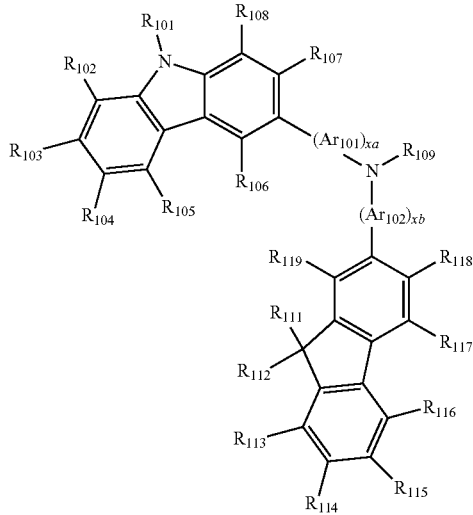

<Chemical Formula 9>

In Chemical Formula 8 above, $Ar_{101}$ and $Ar_{102}$ may be selected from a phenylene group, a pentarenylene group, an indenylene group, a naphthylene group, an azulenylene group, a heptalenylene group, an acenaphthylene group, a fluorenylene group, a phenarenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentarenylene group, an indenylene group, a naphthylene group, an azulenylene group, a heptalenylene group, an acenaphthylene group, a fluorenylene group, a phenarenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each being substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_2$-$C_{10}$ heterocycloalkyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic condensed heteropolycyclic group.

In Chemical Formula 8 above, xa and xb may be each independently an integer of 0 to 5, or may be 0, 1, or 2. For example, xa may be 1, and xb may be 0, but the present disclosure is not limited thereto.

In Chemical Formulas 8 and 9 above, $F_{101}$ to $R_{108}$, $R_{111}$ to $R_{119}$, and $R_{121}$ to $R_{124}$ may be each independently any one of hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, or a hexyl group), and a $C_1$-$C_{10}$ alkoxy group (for example, a methoxy group, an ethoxy group, a propoxy group, a butoxy group, or a pentoxy group); a $C_1$-$C_{10}$ alkyl group and a $C_1$-$C_{10}$ alkoxy group, each being substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof; a phenyl group, a naphthyl group, an anthracenyl group, a fluorenyl group and a pyrenyl group; and a phenyl group, a naphthyl group, an anthracenyl group, a fluorenyl group and a pyrenyl group, each being substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group.

In Chemical Formula 8, $R_{109}$ may be any one of a phenyl group, a naphthyl group, an anthracenyl group, a fluorenyl group and a pyrenyl group; and a phenyl group, a naphthyl group, an anthracenyl group, a fluorenyl group and a pyrenyl group, each being substituted with at least one of deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group.

According to an embodiment, the compound represented by Chemical Formula 8 above may be represented by Chemical Formula 8A below, but the present disclosure is not limited thereto.

<Chemical Formula 8A>

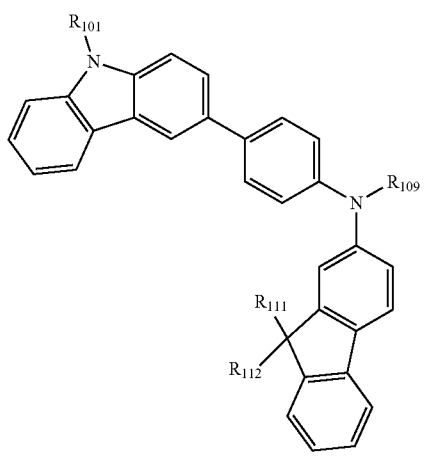

In Chemical Formula 8A above, for detailed descriptions of $R_{101}$, $R_{111}$, $R_{112}$ and $R_{109}$, refer to the above descriptions.

For example, the compound represented by Chemical Formula 8 and the compound represented by Chemical Formula 9 may include the following compounds HT1 to HT20, but the present disclosure is not limited thereto.

HT1

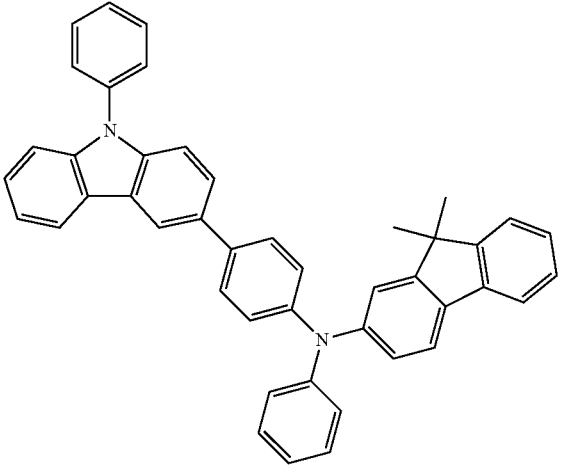

HT2

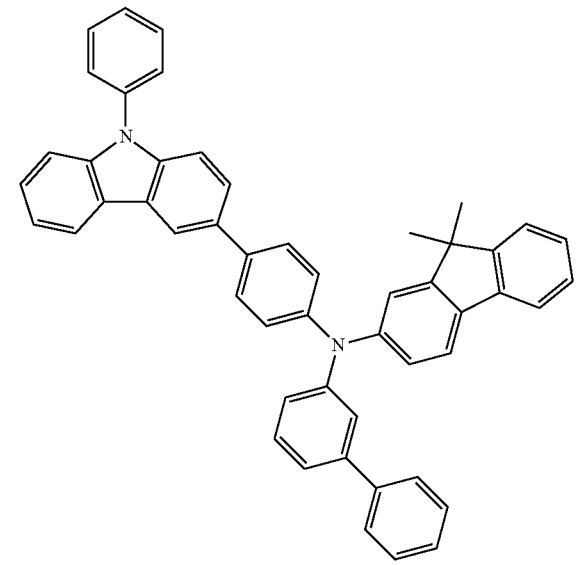

HT3
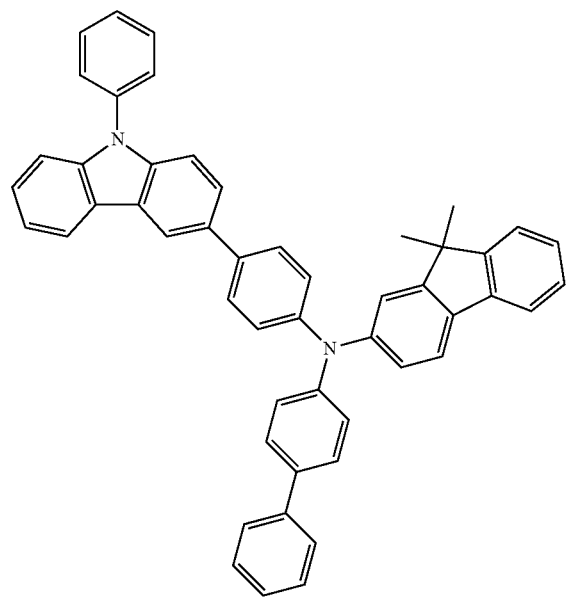
HT5
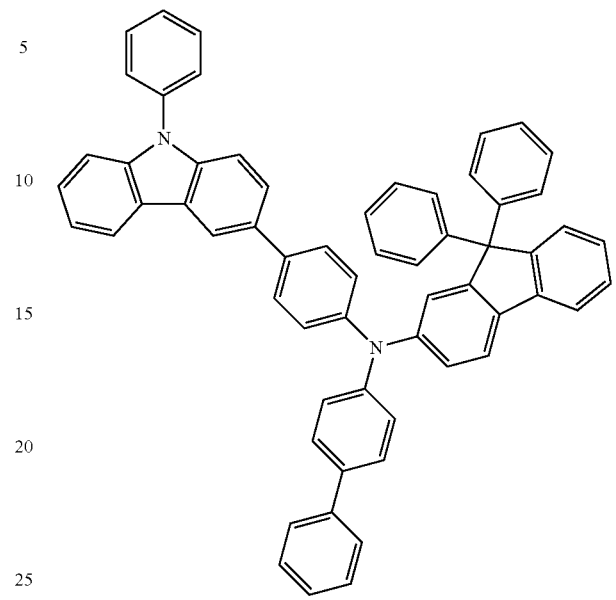
HT4
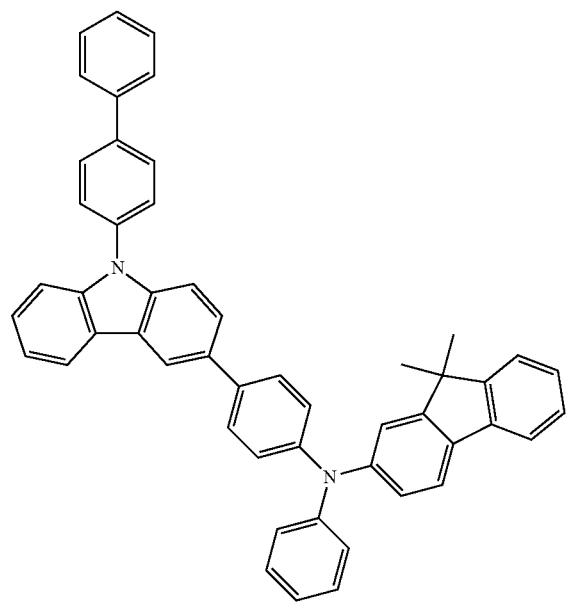
HT6
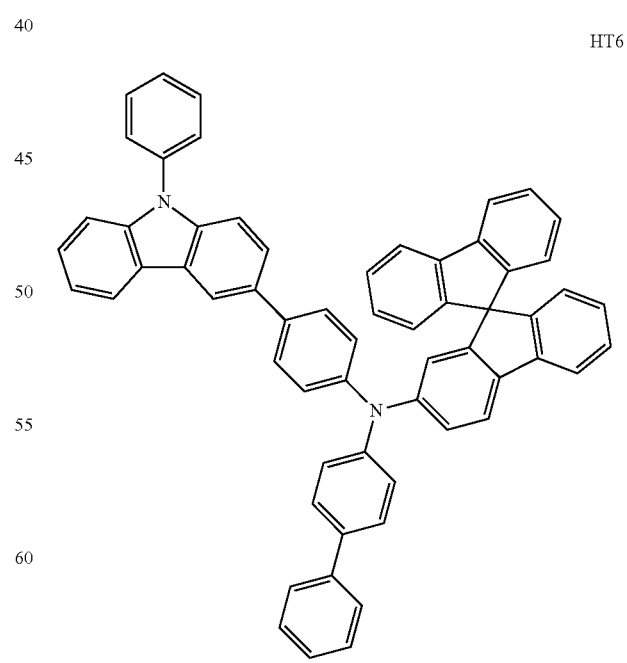

HT7
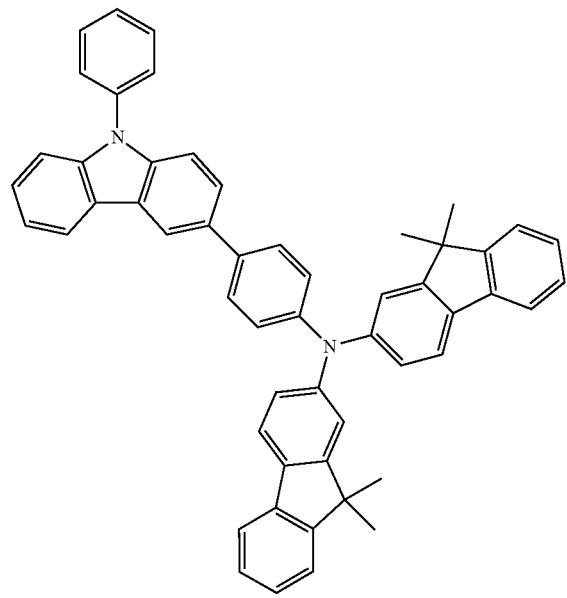
HT9
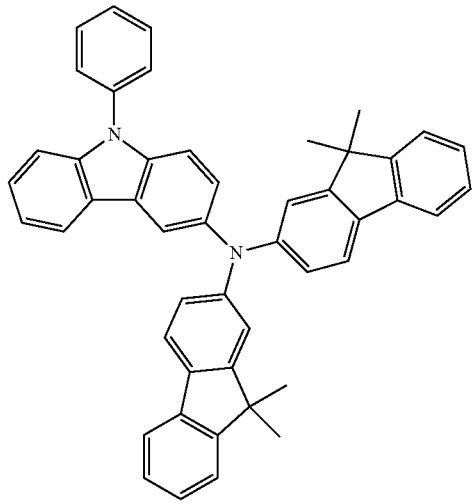
HT8
HT10

HT11
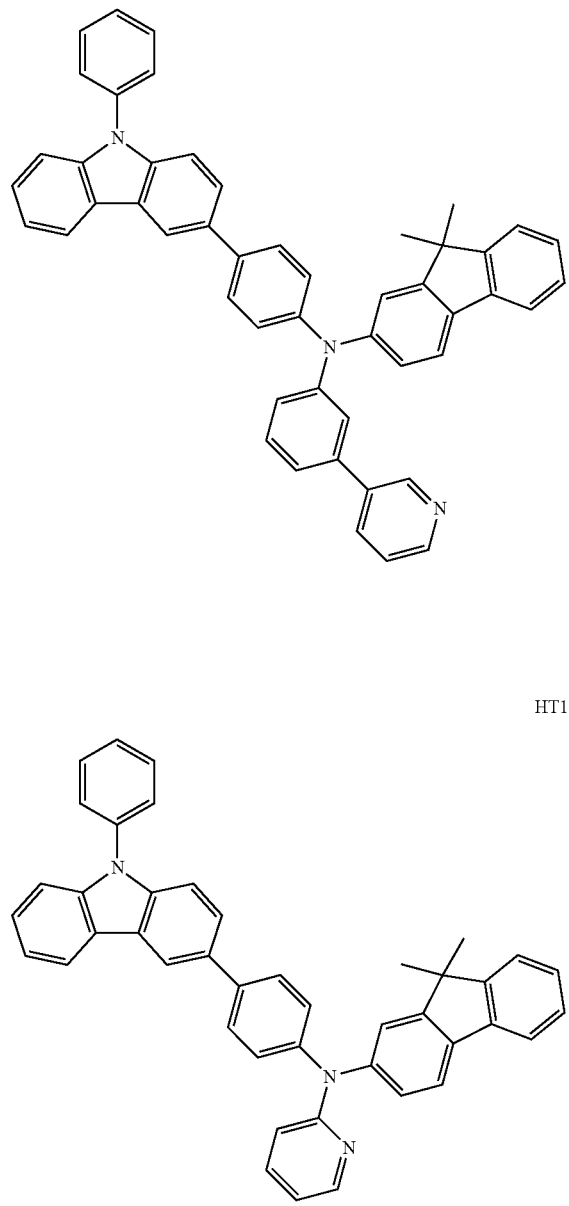
HT12
HT13
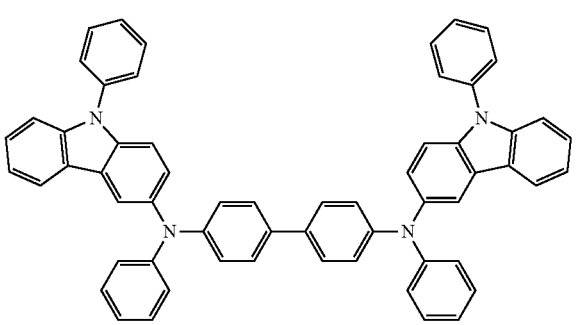
HT14
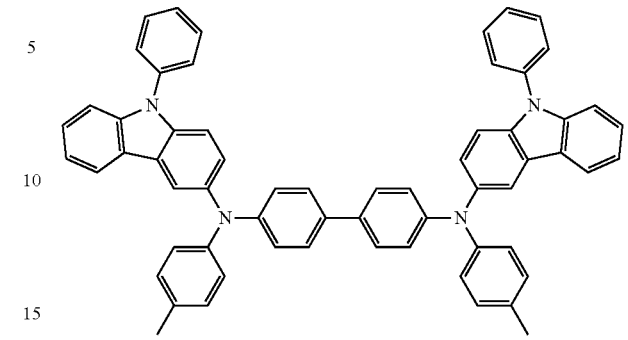
HT15
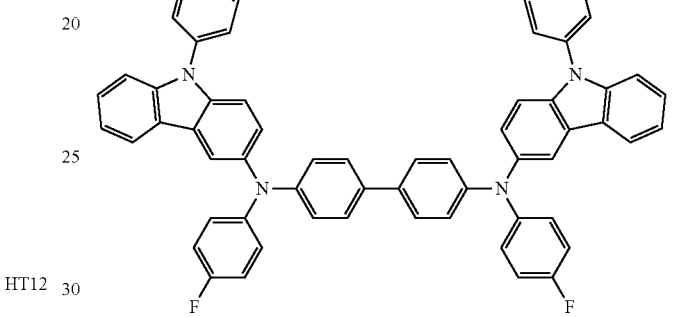
HT16
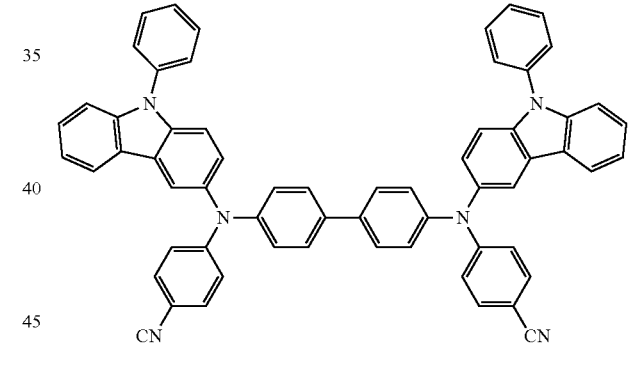
HT17
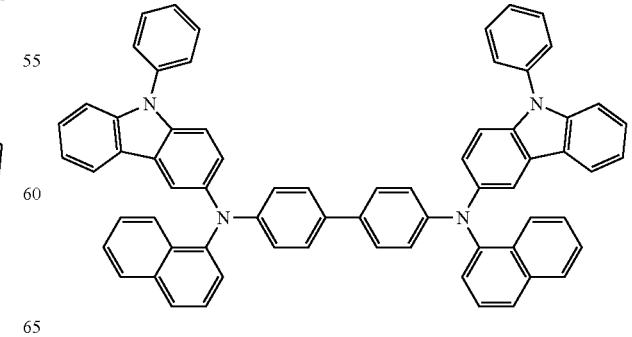

HT18

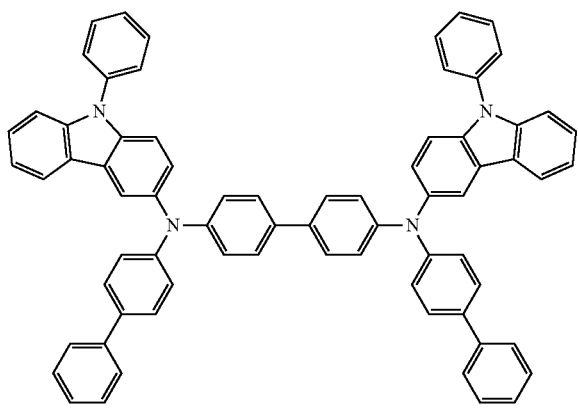

HT19

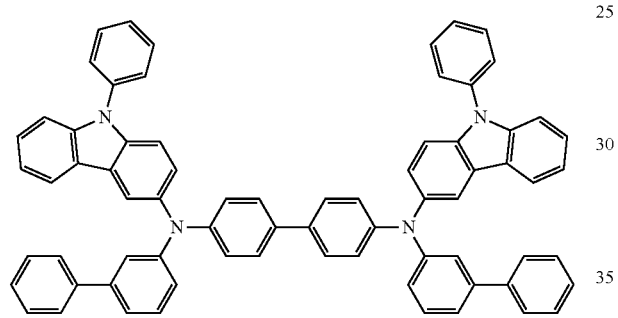

HT20

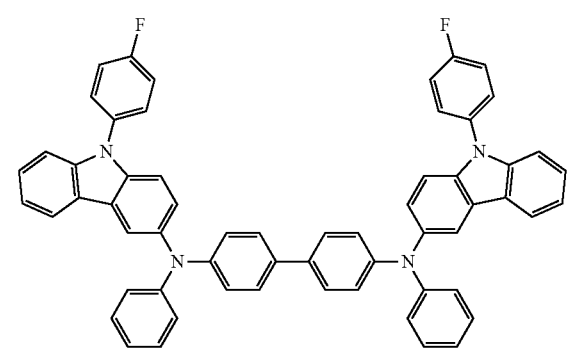

The hole transport region may have a thickness of about 100 Å to about 10000 Å, for example, about 100 Å to about 1000 Å. When the hole transport region includes both a hole injection layer and a hole transport layer, the hole injection layer may have a thickness of about 100 Å to about 10000 Å, for example, about 100 Å to about 1000 Å, and the hole transport layer may have a thickness of about 50 Å to about 2000 Å, for example, about 100 Å to about 1500 Å. When the thickness of the hole transport region, the thickness of the hole injection layer, and the thickness of the hole transport layer satisfy the above-described ranges, satisfactory hole transport characteristics may be obtained without a substantial increase in driving voltage.

The hole transport region may further include a charge-generating material to improve conductivity, in addition to the above-described material. The charge-generating material may be uniformly or non-uniformly dispersed in the hole transport region.

The charge-generating material may be, for example, a p-dopant. The p-dopant may be one of a quinone derivative, a metal oxide, and a cyano group-containing compound, but is not limited thereto. Non-limiting examples of the p-dopant may include, but are not limited to, quinone derivatives such as tetracyanoquinonedimethane (TCNQ) and 2,3,5,6-tetrafluoro-tetracyano-1,4-benzoquinonedimethane (F4-TCNQ); metal oxides such as tungsten oxide and molybdenum oxide; and a cyano group-containing compound such as Compound HT-D1 below.

<Compound HT-D1>

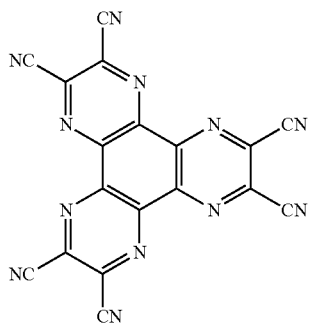

<F4-TCNQ>

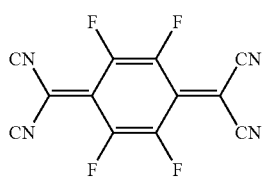

The hole transport region may further include a buffer layer.

The buffer layer may serve to increase efficiency by compensating for an optical resonance distance according to a wavelength of light emitted from the emission layer.

The emission layer EML may be formed on the hole transport region by using a method such as a vacuum deposition, spin coating, casting method, or LB. When the emission layer is formed by vacuum deposition or spin coating, deposition conditions and coating conditions thereof vary depending on compounds used, but in general, may be selected from within the same range of conditions as those of the hole injection layer.

The emission layer may include a host and a dopant. The host may include one or more of the soluble graphene quantum dots above.

The host may include at least one of the following TPBi, TBADN, ADN (also referred to as "DNA"), CBP, CDBP, and TCP, in addition to the soluble graphene quantum dots:

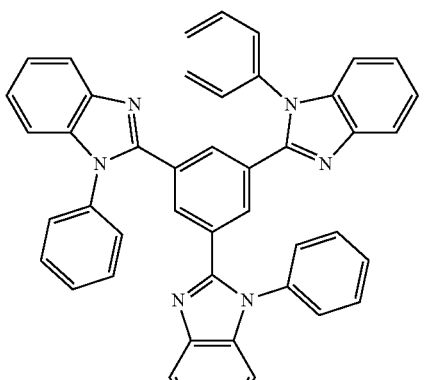

TPBi

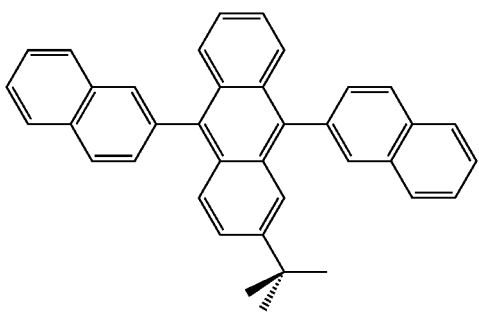

TBADN

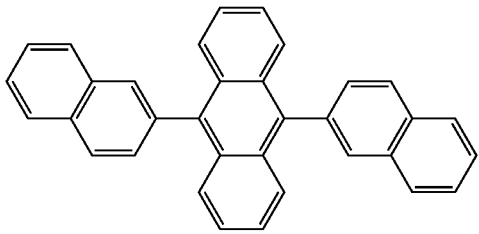

ADN

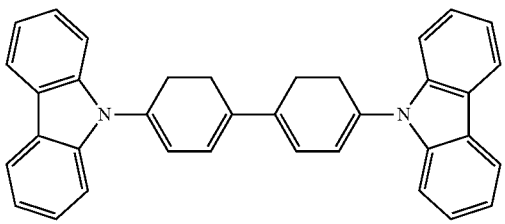

CBP

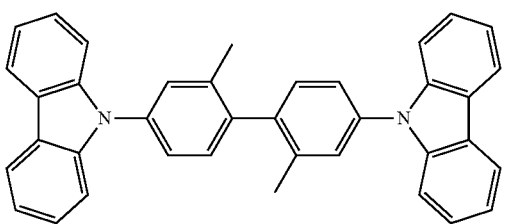

CDBP

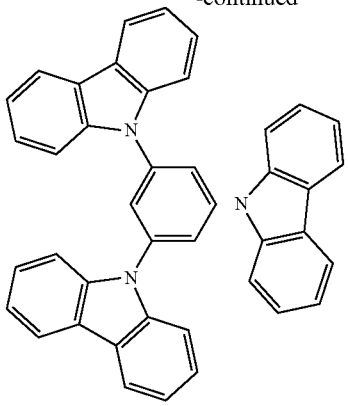

TCP

When the organic light-emitting device is a full color organic light-emitting device, the emission layer may be patterned into a red emission layer, a green emission layer, and a blue emission layer. Alternatively, the emission layer may have a structure in which a red emission layer, a green emission layer, and/or a blue emission layer are stacked, and thus various modifications such as emission layers emitting white light are possible. Hosts in the red emission layer, the green emission layer, and the blue emission layer may include the soluble graphene quantum dots. According to an embodiment, the host in the green emission layer may include the soluble graphene quantum dots.

The dopant in the emission layer may include a fluorescent dopant that emits light according to a fluorescence emission mechanism or a phosphorescent dopant that emits light according to a phosphorescence emission mechanism.

According to an embodiment, the emission layer may include a host including the soluble graphene quantum dots and a phosphorescent dopant. The phosphorescent dopant may include an organometallic complex including a transition metal (for example, iridium (Ir), platinum (Pt), osmium (Os), or rhodium (Rh)).

The phosphorescent dopant may include an organometallic compound represented by Chemical Formula 10 below:

<Chemical Formula 10>

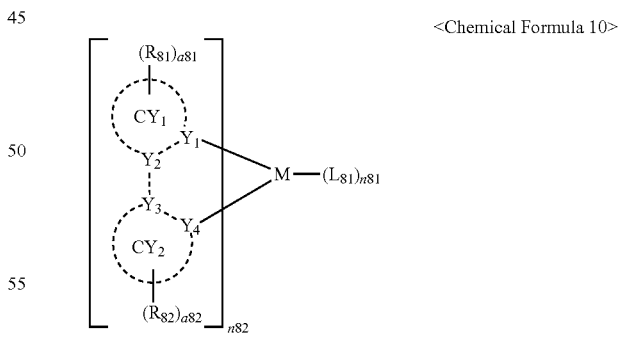

In Chemical Formula 10, M is selected from iridium (Ir), platinum (Pt), osmium (Os), titanium (Ti), zirconium (Zr), hafnium (Hf), europium (Eu), terbium (Tb), and thorium (Tm);

Y1 to Y4 are each independently carbon (C) or nitrogen (N);

$Y_1$ and $Y_2$ are connected by a single bond or a double bond, and $Y_3$ and $Y_4$ are connected by a single bond or a double bond;

CY$_1$ and CY$_2$ are each independently selected from benzene, naphthalene, fluorene, spiro-fluorene, indene, pyrrole, thiophene, furan, imidazole, pyrazole, thiazole, isothiazole, oxazole, iso isoxazole, pyridine, pyrazine, pyrimidine, pyridazine, quinoline, isoquinoline, benzoquinoline, quinoxaline, quinazoline, carbazole, benzoimidazole, benzofuran, benzothiophene, isobenzothiophene, selected from benzoxazole, isobenzoxazole, triazole, tetrazole, oxadiazole, triazine, dibenzofuran, and dibenzothiophene, and CY$_1$ and CY$_2$ are optionally bonded to each other through a single bond or an organic linking group;

R$_{81}$ and R$_{82}$ are each independently selected from hydrogen, deuterium, —F, —Cl, —Br, —I, a hydroxyl group, a cyano group, a nitro group, an amino group, an amidino group, a hydrazine group, a hydrazone group, carboxylic acid or a salt thereof, sulfonic acid or a salt thereof, phosphoric acid or a salt thereof, —SF$_5$; a substituted or unsubstituted C$_1$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_3$-C$_{10}$ cycloalkyl group, a substituted or unsubstituted C$_2$-C$_{10}$ heterocycloalkyl group, a substituted or unsubstituted C$_3$-C$_{10}$ cycloalkenyl group, a substituted or unsubstituted C$_2$-C$_{10}$ heterocycloalkenyl group, a substituted or unsubstituted C$_6$-C$_{60}$ aryl group, a substituted or unsubstituted C$_6$-C$_{60}$ aryloxy group, a substituted or unsubstituted C$_6$-C$_{60}$ arylthio group, a substituted or unsubstituted C$_2$-C$_{60}$ heteroaryl group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), and —B(Q$_6$)(Q$_7$);

a81 and a82 are each independently selected from an integer of 1 to 5;

n81 is selected from an integer of 0 to 4;

n82 is 1, 2 or 3;

L$_{81}$ is selected from a monovalent organic ligand, a divalent organic ligand and a trivalent organic ligand;

In Chemical Formula 10 above, the bond between Y$_1$ and Y$_2$ and the bond between Y$_3$ and Y$_4$ are, each independently, a single bond or a double bond.

For the description of R$_{81}$ and R$_{82}$, refer to the description of R$_5$ in the present specification.

The phosphorescent dopant may include at least one of Compounds PD1 to PD74 below, but the present disclosure is not limited thereto:

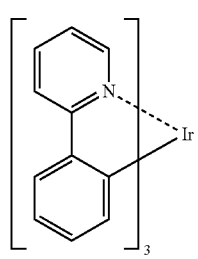

PD1

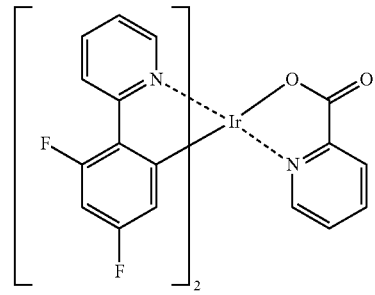

PD2

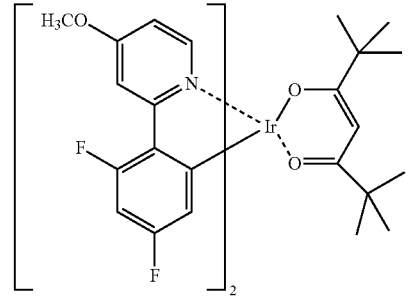

PD3

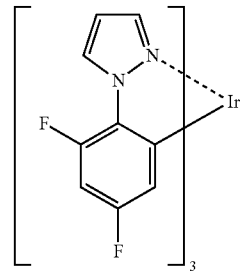

PD4

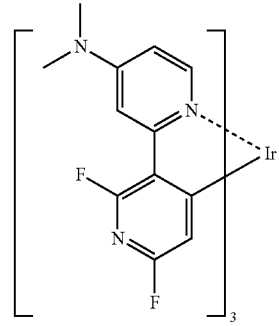

PD5

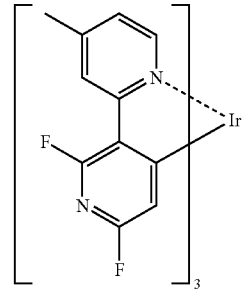

PD6

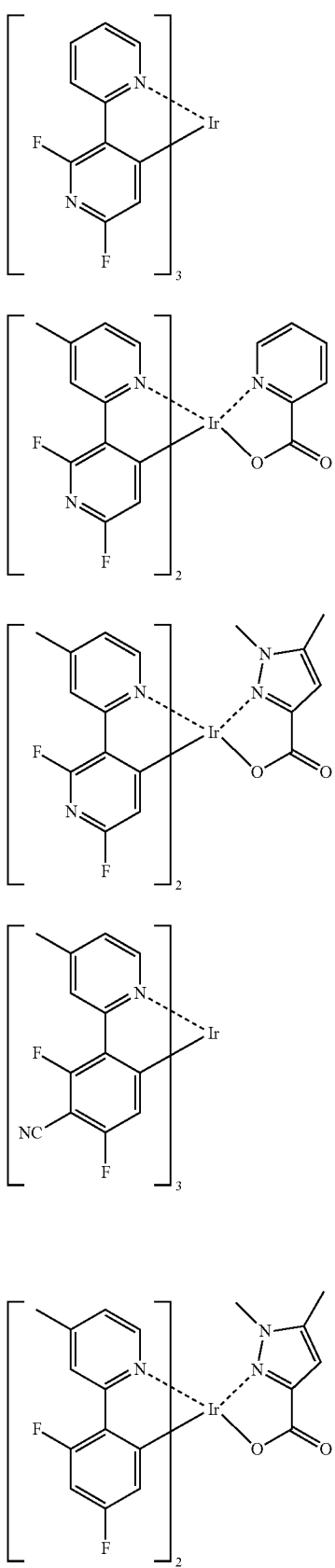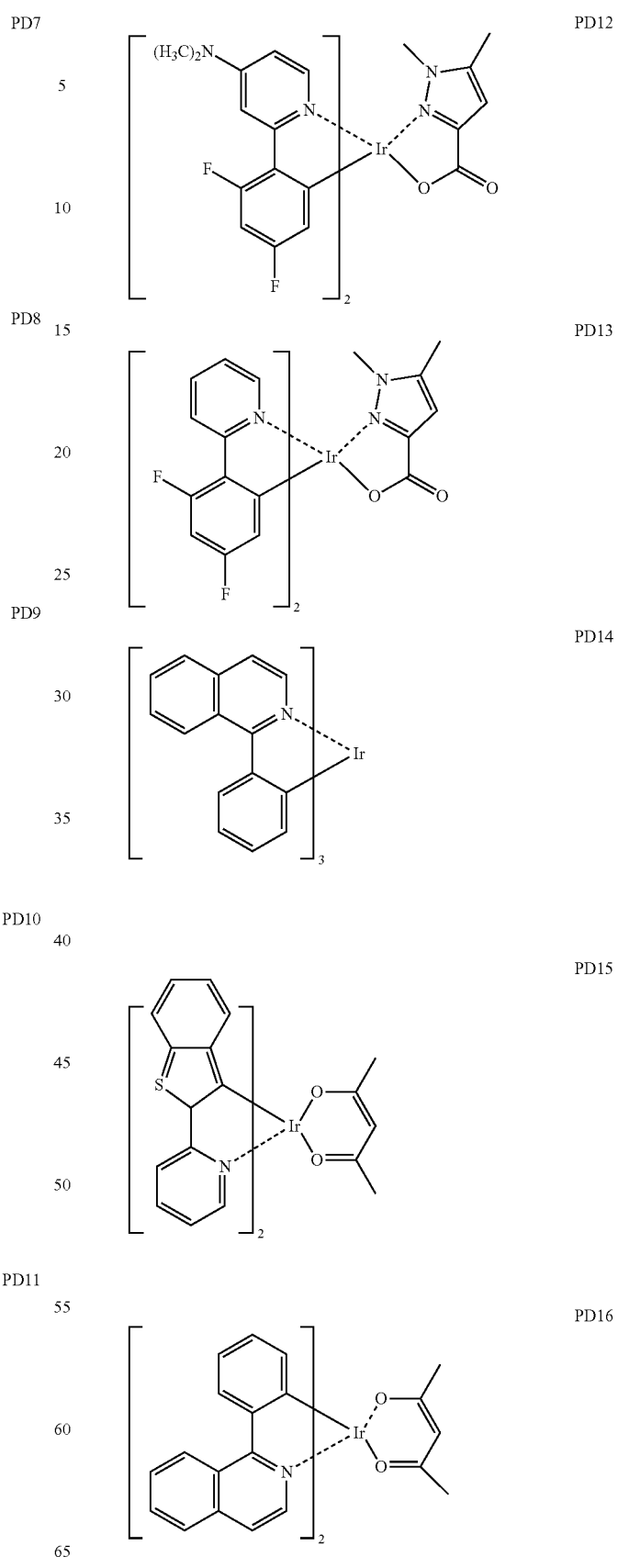

-continued
PD17
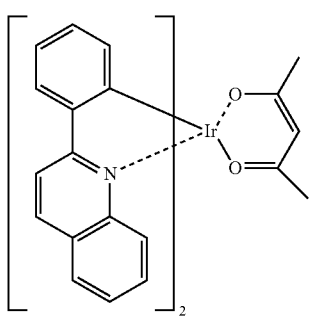
PD18
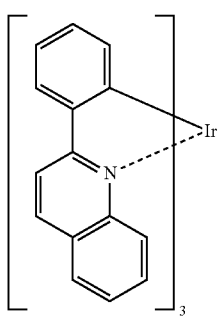
PD19
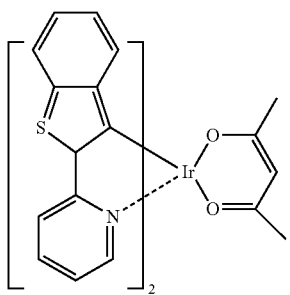
PD20
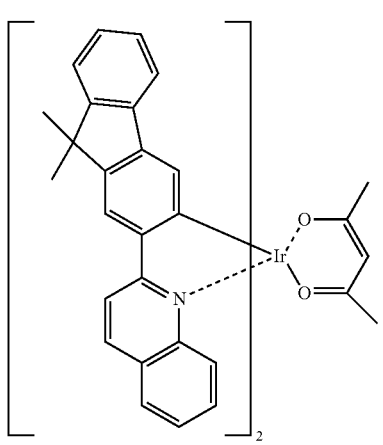
-continued
PD21
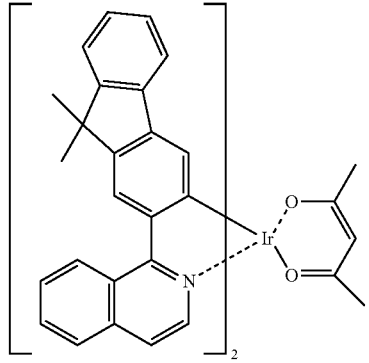
PD22
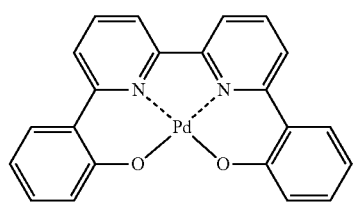
PD23
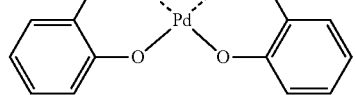
PD24
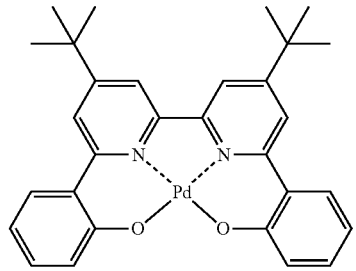
PD25
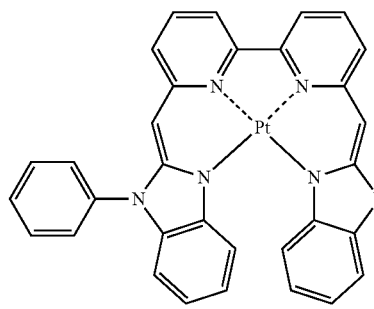
PD26
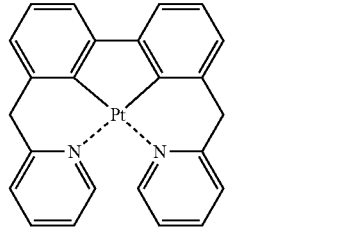

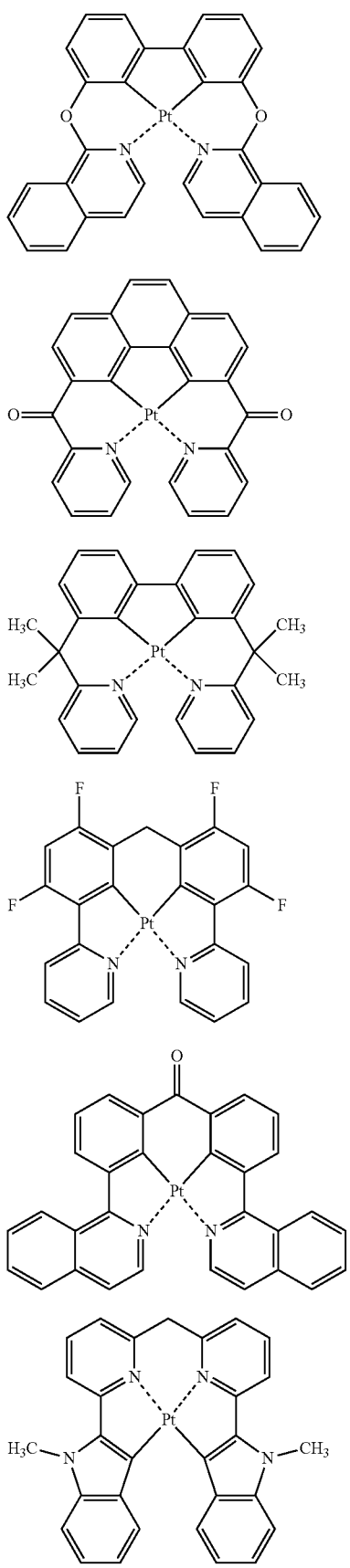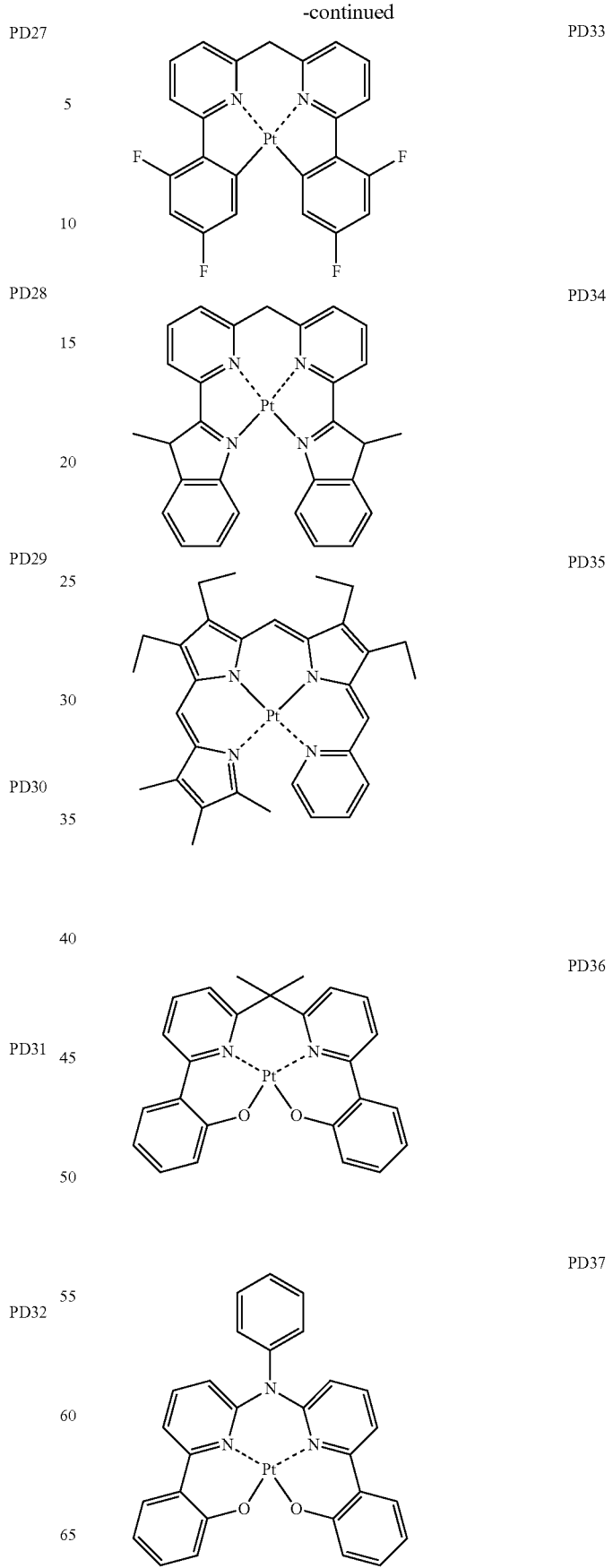

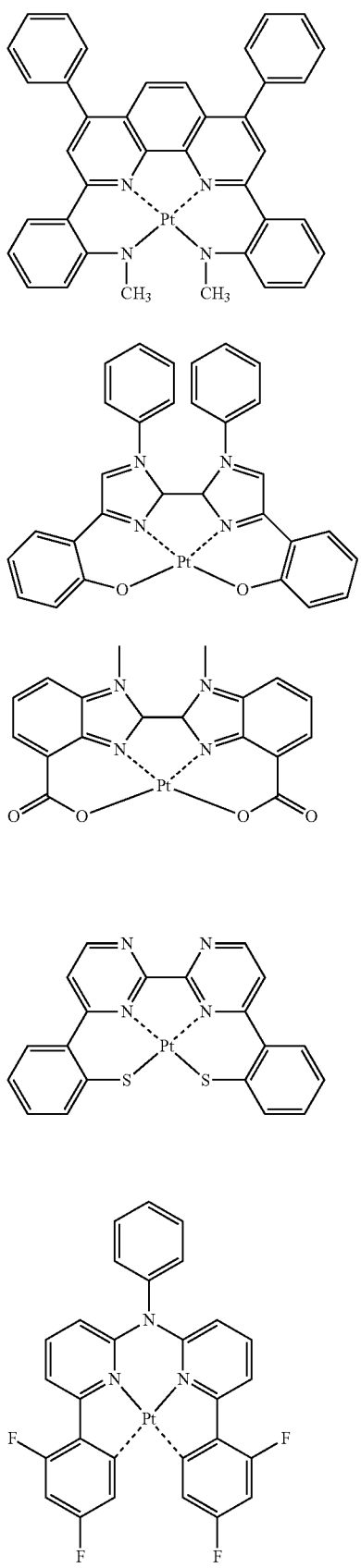
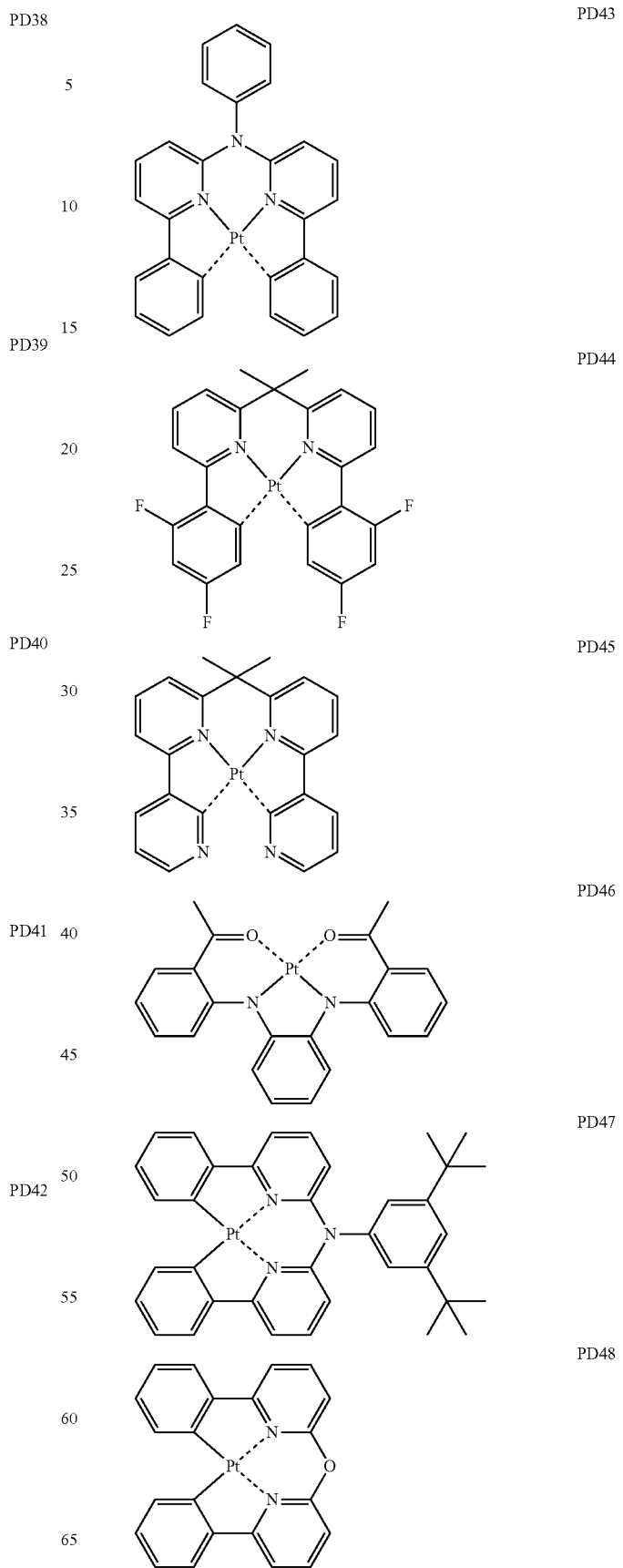

-continued
PD49
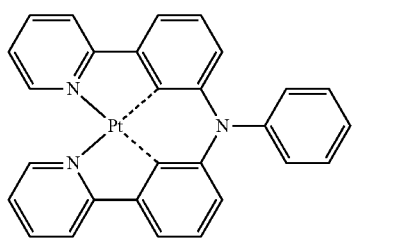
PD50
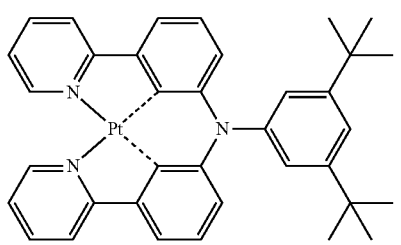
PD51
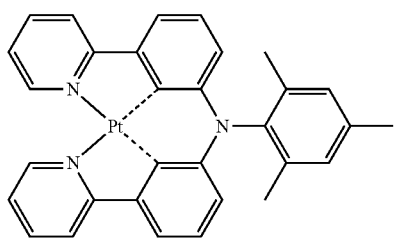
PD52
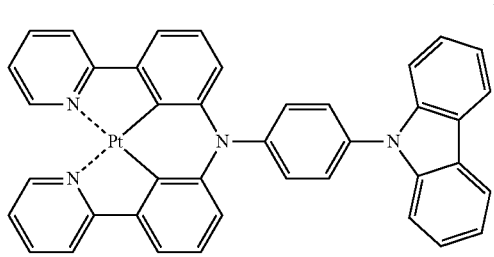
PD53
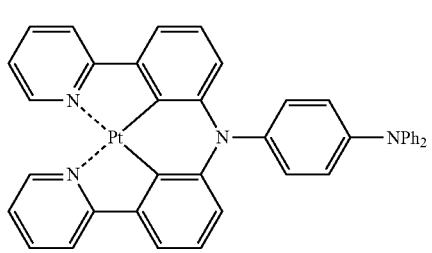
PD54
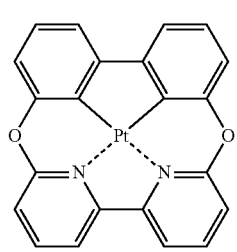
-continued
PD55
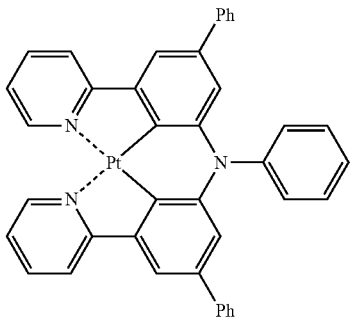
PD56
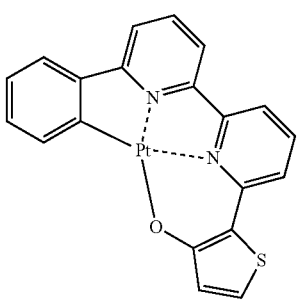
PD57
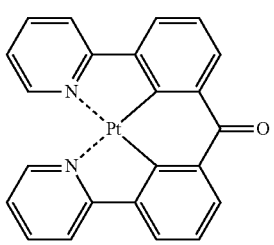
PD58
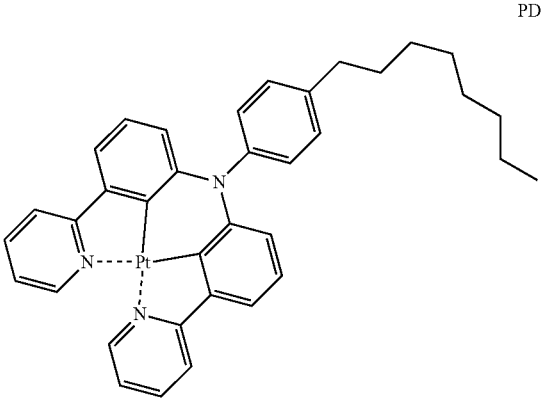
PD59
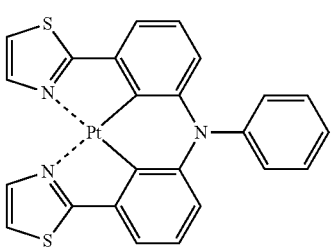

PD60 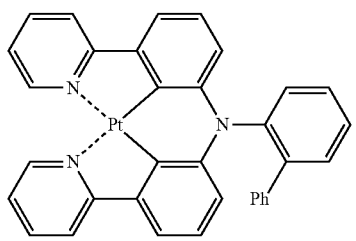
PD61 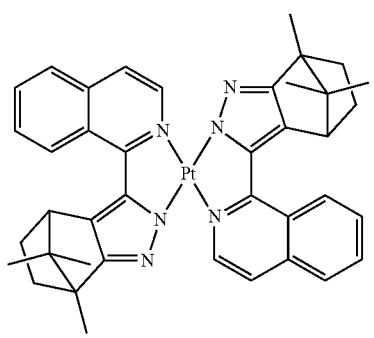
PD62 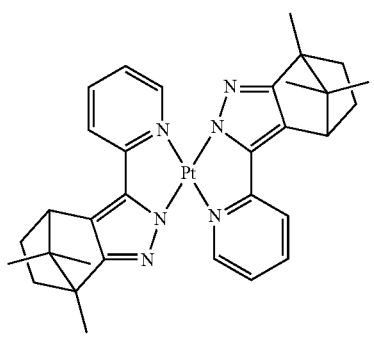
PD63 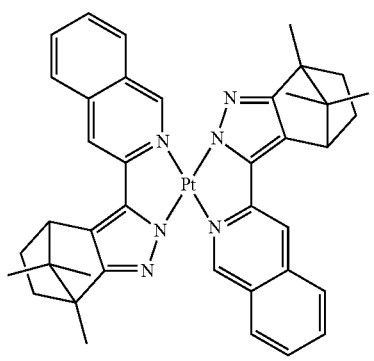
PD64 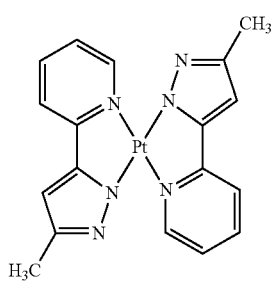
PD65 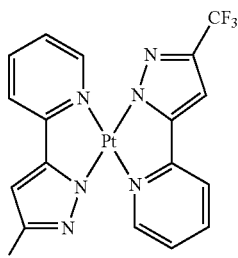
PD66 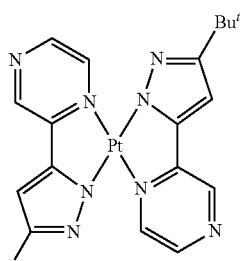
PD67 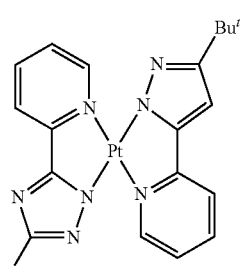
PD68 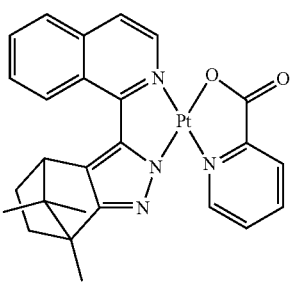
PD69 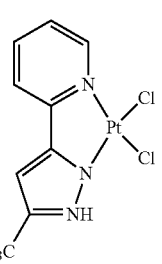

PD70 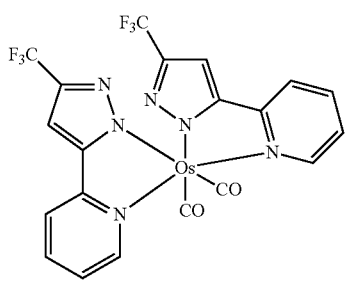
PD71 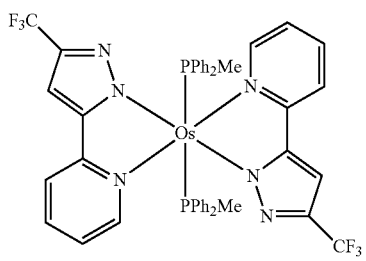
PD72 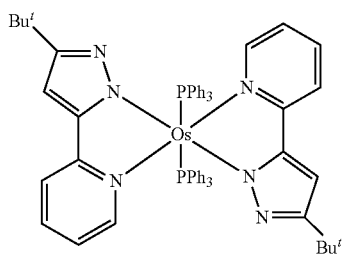
PD73 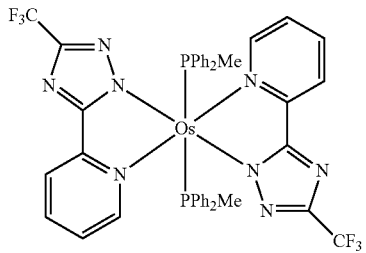
PD74 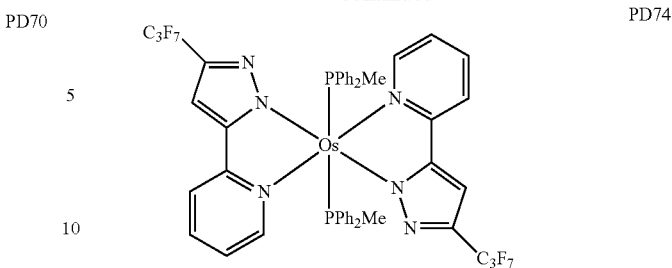
Alternatively, the phosphorescent dopant may include Compound PtOEP or Compound PhGD:
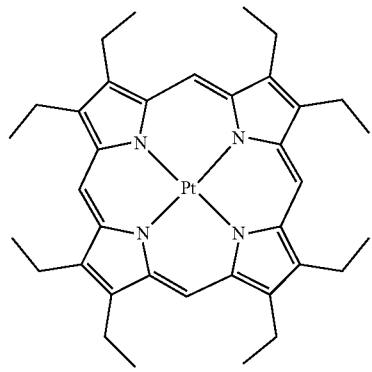
PtOEP
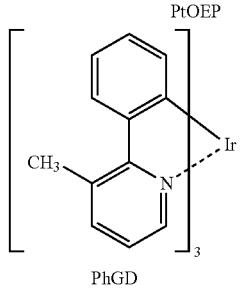
PhGD
The fluorescent dopant may include at least one of the following DPVBi, DPAVBi, TBPe, DCM, DCJTB, Coumarin 6 and C545T.
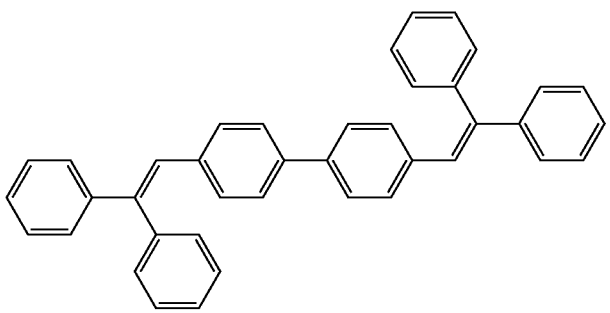
DPVBi -continued
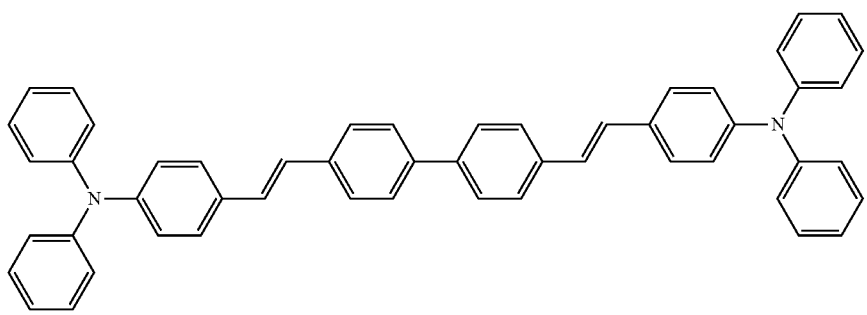
DPAVBi
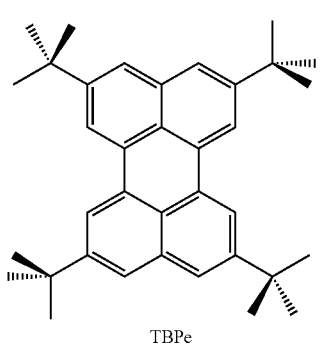
TBPe
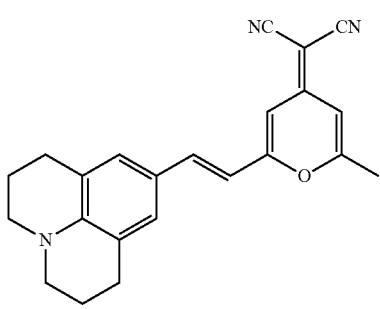
DCM
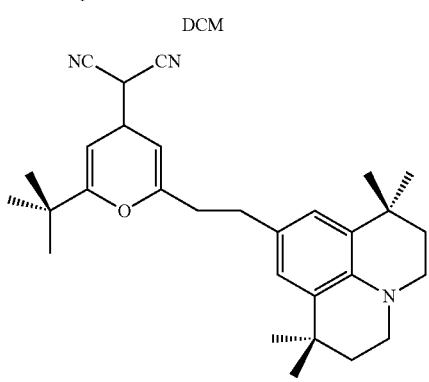
DCJTB
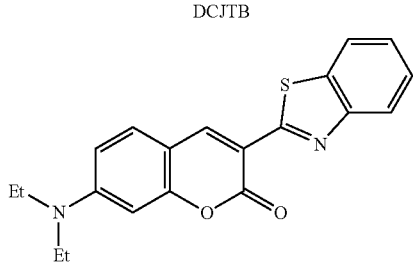
Coumarin 6

-continued

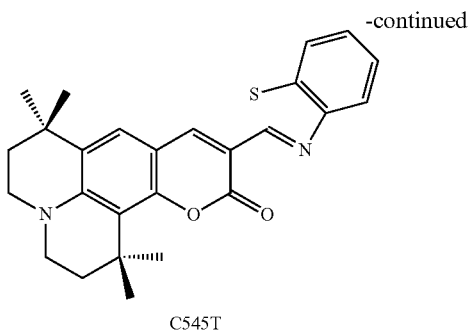

C545T

When the emission layer includes a host and a dopant, the content of the dopant generally may be selected from about 0.01 parts by weight to about 15 parts by weight based on about 100 parts by weight of the host, but is not limited thereto.

The emission layer may have a thickness of about 100 Å to about 1000 Å, for example, about 200 Å to about 600 Å. When the thickness of the emission layer satisfies the above range, the emission layer may exhibit excellent luminescent characteristics without a substantial increase in driving voltage.

Next, an electron transport region is disposed on the emission layer.

The electron transport region may include at least one of a hole blocking layer, an electron transport layer, and an electron injection layer.

For example, the electron transport region may have a structure of an electron transport layer, a hole blocking layer/electron transport layer/electron injection layer, or an electron transport layer/electron injection layer, but the structure thereof is not limited thereto. The electron transport layer may have a single layer structure or a multilayer structure including two or more different materials.

For the formation conditions of the hole blocking layer, the electron transport layer, and the electron injection layer in the electron transport region, refer to the formation conditions of the hole injection layer.

When the electron transport region includes a hole blocking layer, the hole blocking layer may include, for example, at least one of BCP and Bphen, but the present disclosure is not limited thereto.

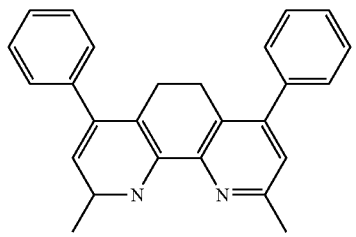

BCP

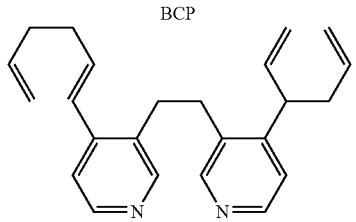

Bphen

The hole blocking layer may have a thickness of about 20 Å to about 1000 Å, for example, about 30 Å to about 300 Å. When the thickness of the hole blocking layer satisfies the above range, excellent hole blocking characteristics can be obtained without a substantial increase in driving voltage.

The electron transport layer may further include at least one of BCP and Bphen above and Alq3, Balq, TAZ, and NTAZ below.

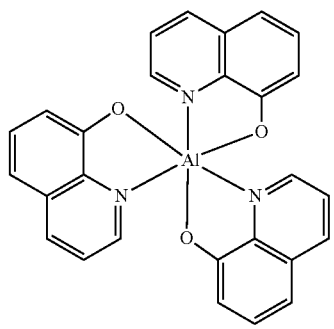

Alq3

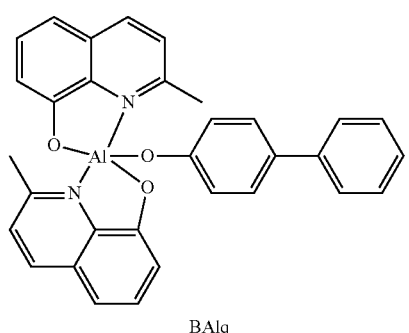

BAlq

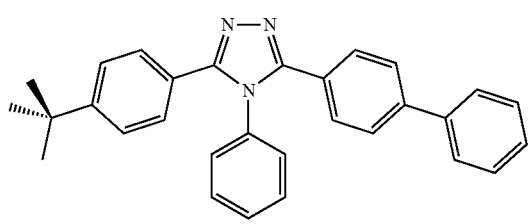

TAZ

-continued

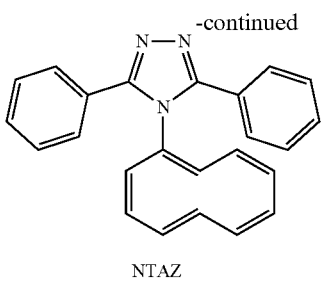

NTAZ

Alternatively, the electron transport layer may include at least one of Compounds ET1 and ET2 below, but the present disclosure is not limited thereto.

ET1

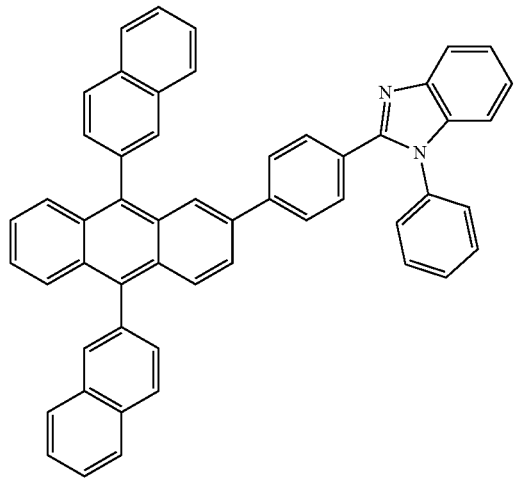

ET2

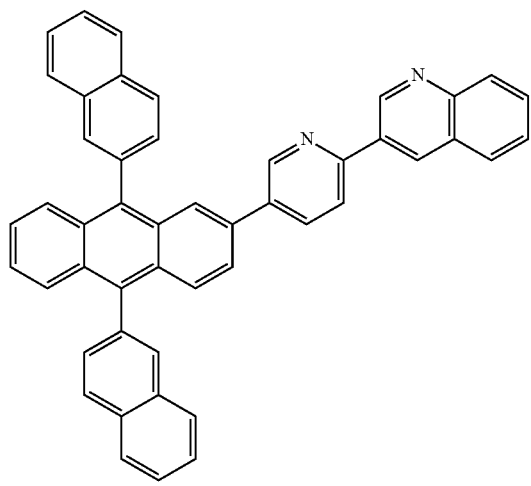

The electron transport layer may have a thickness of about 100 Å to about 1000 Å, for example, about 150 Å to about 500 Å. When the thickness of the electron transport layer satisfies the above range, satisfactory electron transport characteristics may be obtained without a substantial increase in driving voltage.

The electron transport layer may further include a metal-containing material in addition to the above-described materials.

The metal-containing material may include a Li complex. The Li complex may include, for example, the following compound ET-D1 (lithium quinolate, LiQ) or ET-D2.

ET-D1

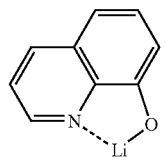

ET-D2

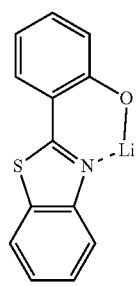

Further, the electron transport region may include an electron injection layer (EIL) that facilitates the injection of electrons from the second electrode 19.

The electron injection layer may include at least one selected from LiF, NaCl, CsF, $Li_2O$, and BaO.

The electron injection layer may have a thickness of about 1 Å to about 100 Å, or about 3 Å to about 90 Å. When the thickness of the electron injection layer satisfies the above range, satisfactory electron injection characteristics may be obtained without a substantial increase in driving voltage.

The second electrode 19 is provided on the organic layer 15. The second electrode 19 may be a cathode. As the material for the second electrode 19, a metal, an alloy, an electrically conductive compound, and a combination thereof, each having a relatively low work function, may be used. As a specific example, lithium (Li), magnesium (Mg), aluminum (Al), aluminum-lithium (Al—Li), calcium (Ca), magnesium-indium (Mg—In), magnesium-silver (Mg—Ag), or the like may be used as the material for forming the electrode 19. Alternatively, in order to obtain a front type light-emitting device, various modifications are possible, such as forming the transmissive second electrode 19 using ITO or IZO.

Heretofore, the organic light-emitting device has been described with reference to FIG. 20, but the present disclosure is not limited thereto.

The soluble graphene quantum dot described above may be applied to other electrical devices (e.g., transistor) in addition to light emitting devices.

As used herein, the $C_1$-$C_{60}$ alkyl group refers to a linear or branched aliphatic hydrocarbon monovalent group having 1 to 60 carbon atoms, and specific examples thereof include a methyl group, an ethyl group, a propyl group, an isobutyl group, a sec-butyl group, a ter-butyl group, a pentyl group, an iso-amyl group, and a hexyl group. As used herein, the $C_1$-$C_{60}$ alkylene group refers to a divalent group having the same structure as the $C_1$-$C_{60}$ alkyl group.

As used herein, the $C_1$-$C_{60}$ alkoxy group refers to a monovalent group having the formula of —OA101 (where A101 is a $C_1$-$C_{60}$ alkyl group), and specific examples thereof include a methoxy group, an ethoxy group, and an isopropyloxy group.

As used herein, the $C_2$-$C_{60}$ alkenyl group has a structure including one or more carbon double bonds at the middle or terminal of the $C_2$-$C_{60}$ alkyl group, and specific examples thereof include an ethenyl group, a propenyl group, and a butenyl group. As used herein, the $C_2$-$C_{60}$ alkenylene group refers to a divalent group having the same structure as the $C_2$-$C_{60}$ alkenyl group.

As used herein, the $C_2$-$C_{60}$ alkenyl group has a structure including one or more carbon triple bonds at the middle or terminal of the $C_2$-$C_{60}$ alkyl group, and specific examples thereof include an ethynyl group and a propyl group. As used herein, the $C_2$-$C_{60}$ alkynylene group refers to a divalent group having the same structure as the $C_2$-$C_{60}$ alkynyl group.

As used herein, the $C_3$-$C_{10}$ cycloalkyl group refers to a monovalent saturated hydrocarbon monocyclic group having 3 to 10 carbon atoms, and specific examples thereof include a cyclopropyl group, a cyclobutyl group, a cyclopentyl group, a cyclohexyl group, and a cycloheptyl group. As used herein, the $C_3$-$C_{10}$ cycloalkylene group refers to a divalent group having the same structure as the $C_3$-$C_{10}$ cycloalkyl group.

As used herein, the $C_2$-$C_{10}$ heterocycloalkyl group refers to a monovalent monocyclic group having 2 to 10 carbon atoms including at least one hetero atom selected from N, O, P and S as a ring-forming atom, and specific examples thereof include a tetrahydrofuranyl group and a tetrahydrothiophenyl group. As used herein, the $C_2$-$C_{10}$ heterocycloalkylene group refers to a divalent group having the same structure as the $C_2$-$C_{10}$ heterocycloalkyl group.

As used herein, the $C_3$-$C_{10}$ cycloalkenyl group, which is a monovalent monocyclic group having 3 to 10 carbon atoms, refers to a group having at least one double bond in the ring but not having aromaticity, and specific examples thereof include a cyclopentenyl group, a cyclohexenyl group, and a cycloheptenyl group. As used herein, the $C_3$-$C_{10}$ cycloalkenylene group refers to a divalent group having the same structure as the $C_3$-$C_{10}$ cycloalkenyl group.

As used herein, the $C_2$-$C_{10}$ heterocycloalkenyl group is a monovalent monocyclic group having 2 to 10 carbon atoms including at least one hetero atom selected from N, O, P and S as a ring-forming atom, and has at least one double bond in the ring thereof. Specific examples of the $C_2$-$C_{10}$ heterocycloalkenyl group may include a 2,3-hydrofuranyl group and a 2,3-hydrothiophenyl group. As used herein, the $C_2$-$C_{10}$ heterocycloalkenylene group refers to a divalent group having the same structure as the $C_2$-$C_{10}$ heterocycloalkenyl group.

As used herein, the $C_6$-$C_{60}$ aryl group refers to a monovalent group having a carbocyclic aromatic system having 6 to 60 carbon atoms, and the $C_6$-$C_{60}$ arylene group refers to a divalent group having a carbocyclic aromatic system having 6 to 60 carbon atoms. Specific examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group include two or more rings, the two or more rings may be fused to each other.

As used herein, the $C_2$-$C_{60}$ heteroaryl group refers to a monovalent group including at least one hetero atom selected from N, O, P and S as a ring-forming atom and having a carbocyclic aromatic system having 2 to 60 carbon atoms, and the $C_2$-$C_{60}$ heteroarylene group refers to a divalent group including at least one hetero atom selected from N, O, P and S as a ring-forming atom and having a carbocyclic aromatic system having 2 to 60 carbon atoms. Specific examples of the $C_2$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_2$-$C_{60}$ heteroaryl group and the $C_2$-$C_{60}$ heteroarylene group include two or more rings, the two or more rings may be fused to each other.

As used herein, the $C_6$-$C_{60}$ aryloxy group refers to —$OA_{102}$ (here, $A_{102}$ is a $C_6$-$C_{60}$ aryl group), and the $C_6$-$C_{60}$ arylthio group refers to —$SA_{103}$ (here, $A_{103}$ is a $C_6$-$C_{60}$ aryl group).

As used herein, the monovalent non-aromatic condensed polycyclic group refers to a monovalent group having two or more rings condensed with each other, including only carbon as a ring-forming atom (for example, may have 8 to 60 carbon atoms), and entirely having non-aromaticity. Specific examples of the non-aromatic condensed polycyclic group include a fluorenyl group and the like. As used herein, the divalent non-aromatic condensed polycyclic group means a divalent group having the same structure as the monovalent non-aromatic condensed polycyclic group.

As used herein, the monovalent non-aromatic condensed heteropolycyclic group refers to a monovalent group having two or more rings condensed with each other, including a heteroatom selected from N, O, P, and S as a ring-forming atom (for example, may have 8 to 60 carbon atoms) in addition to carbon, and entirely having non-aromaticity. The monovalent non-aromatic condensed heteropolycyclic group includes a carbazolyl group and the like. As used herein, the condensed divalent non-aromatic heteropolycyclic group refers to a divalent group having the same structure as the monovalent non-aromatic condensed heteropolycyclic group.

Hereinafter, a compound and an organic light-emitting device according to an embodiment of the present disclosure will be described in more detail with reference to Synthesis Examples and Examples, but the present disclosure is not limited to the following Synthesis Examples and Examples. In the following Synthesis Examples, in the expression "'B' was used instead of 'A'", the amount of 'B' used and the amount of 'A' used are the same as each other based on a molar equivalent.

The present inventive concept will be described in more detail through the following Examples and Comparative Examples. However, these Examples are intended to illustrate the present inventive concept, and the scope of the present inventive concept is not limited thereto.

Synthesis of Soluble Graphene Quantum Dots

Synthesis Example 1: Synthesis of Compound TUD-8

Compound TUD-8 was synthesized according to the following scheme.

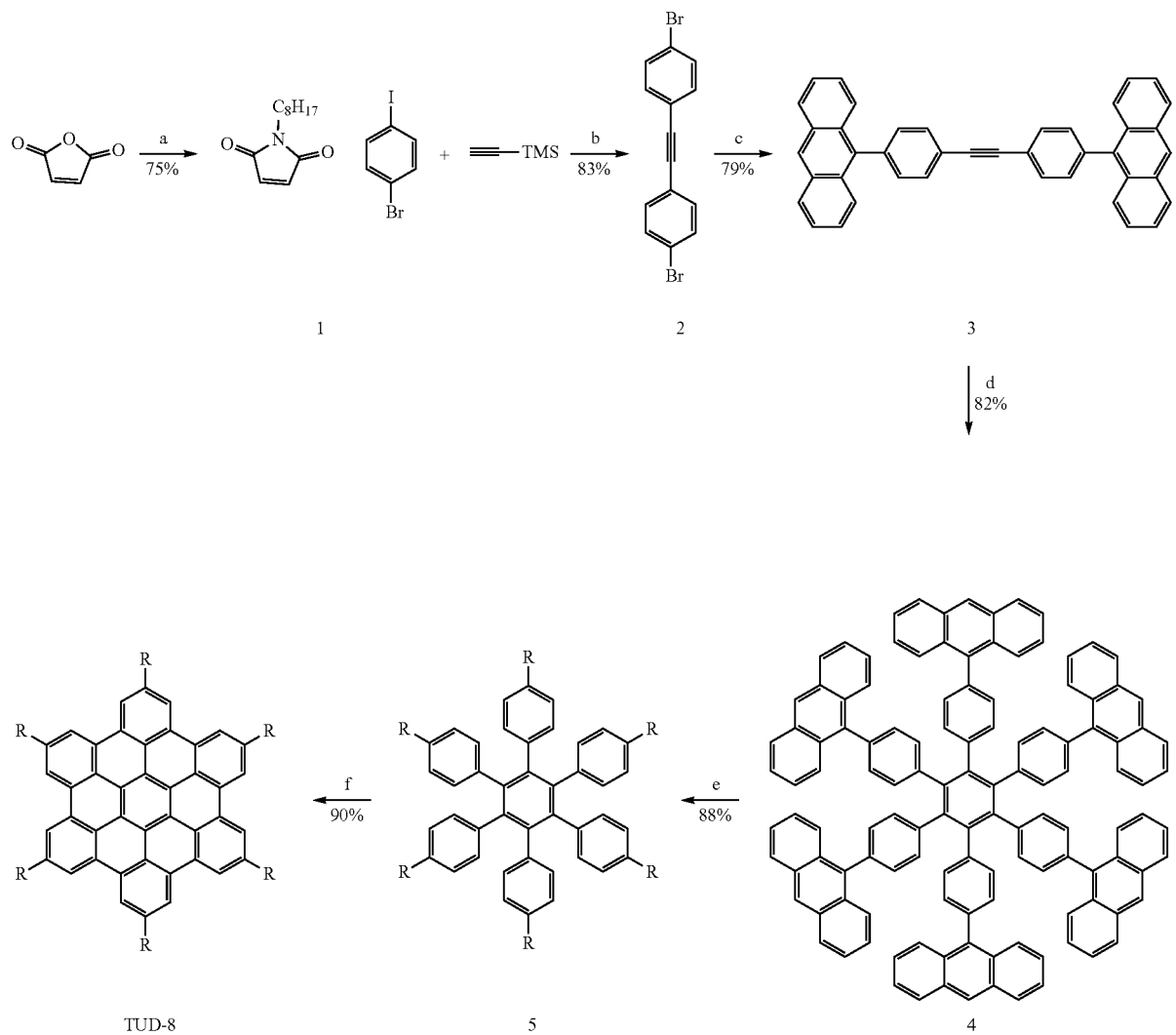

First, N-octylmaleimide (1) was synthesized from maleic anhydride in a yield of 75%. Next, 1,2-bis(4-bromophenyl)ethyne (2) was obtained in a yield of 83% through a coupling reaction between commercially available 1-bromo-4-iodobenzene and trimethylsilylacetylene. Thereafter, 1,2-bis(4-(anthracen-9-yl)phenyl)ethyne (3) was obtained in a yield of 79% by Suzuki coupling reaction between Compound 2 and 9-anthracenboronic acid. Subsequently, Main Intermediate 4 was obtained in 82% yield by cobalt-catalyzed cyclotrimerization of Compound 3, and then Compound 5 was obtained in a yield of 88% by Diels-Alder cycloaddition reaction with Compound 1. Finally, compound TUD-8 was synthesized in a yield of 90% through FeCl3-mediated Scholl reaction of compound 5.

Synthesis Example 2: Synthesis of Compound TUD-9

Compound TUD-9 was synthesized according to the following scheme.

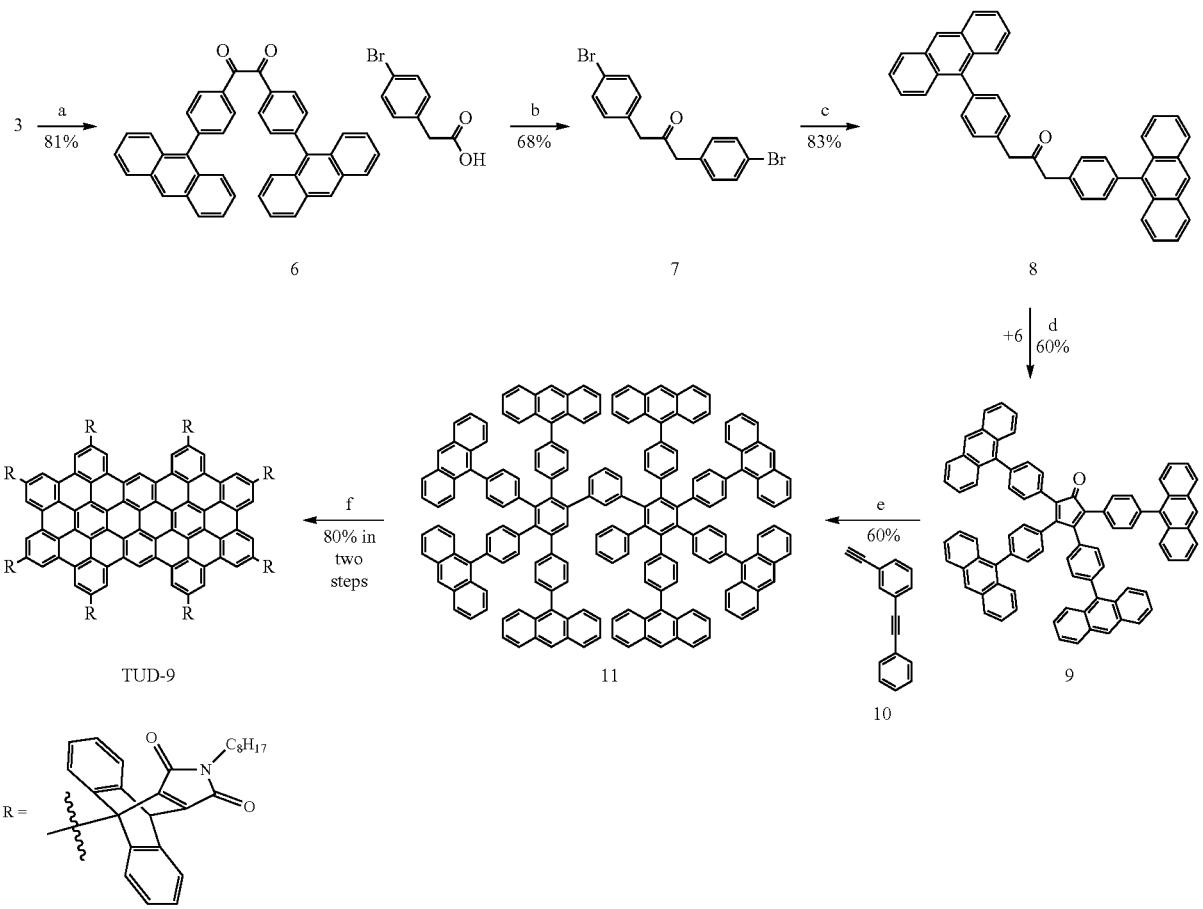

First, 1,2-bis(4-(anthracen-9-yl)phenyl)ethyne (3) was oxidized to obtain Dione 6 in a yield of 81%. Next, 2-(4-bromophenyl)acetic acid was self-condensed using dicyclohexylcarbodiimide (DCC) and N,N-dimethylaminopyridine (DMAP) as a catalyst to obtain 1,3-bis(4-bromophenyl)propan-2-one (7) obtained in a yield of 68%, and this product was converted into 1,3-bis(4-(anthracen-9-yl)phenyl)propan-2-one (8) by Suzuki coupling reaction with commercially available 9-anthracenboronic acid. Then, 2,3,4,5-tetrakis(4-(anthracen-9-yl)phenyl)cyclopenta-2,4-dien-1-one (9) was obtained in a yield of 60% by a condensation reaction of Compounds 8 and 6, and followed by Diels-Alder reaction with 2,2'-diethynyl-1,1'-biphenyl (10) to obtain Oligophenylene Intermediate 11 in a yield of 60%. Finally, Compound 11 was additionally reacted with n-octyl maleimide (1) through Diels-Alder cycloaddition reaction, and then Compound TUD-9 was obtained in a yield of 80% in two steps through intramolecular oxidative cyclodehydrogenation.

Synthesis Example 3: Synthesis of Compound TUD-10

Compound TUD-10 was synthesized according to the following scheme.

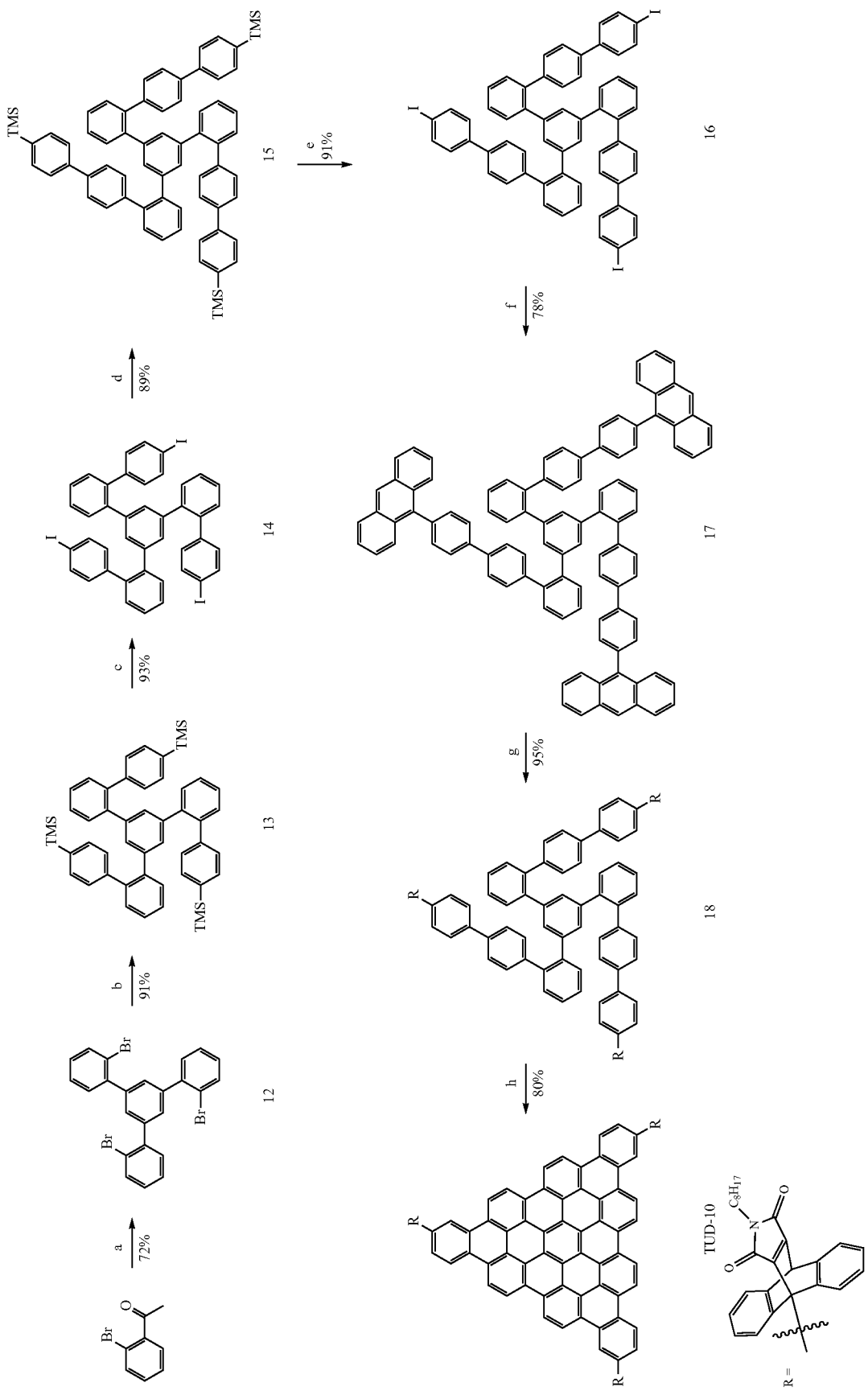

Compound TUD-10 was synthesized in 8 steps from commercially available 2-bromoacetophenone. First, 1,3,5-tris-(2'-bromophenyl)-benzene (12) was obtained in a yield of 72% by trifluoromethanesulfonic acid-mediated trimerization of 2-bromoacetophenone. Compound 13 was obtained in a yield of 91% by Suzuki cross-coupling reaction of compound 12 and 4-trimethylsilyl-1-phenylboronic acid, which was treated with iodine monochloride to be converted into Compound 14 in a yield of 93%. Then, Compound 16 was obtained in a yield of 81% in two steps by Suzuki coupling of triiodo 14 with 4-trimethylsilyl-1-phenylboronic acid and subsequent iodine monochloride treatment. Next, oligophenylene 17 was obtained in a yield of 78% by Suzuki coupling of compound 16 and 9-anthracenboronic acid. Compound 17 was additionally reacted with N-octyl maleimide (1) through Diels-Alder cycloaddition to obtain Compound 18 having a bulky group in a yield of 95%. Finally, Compound TUD-10 was obtained in a yield of 80% through intramolecular oxidative cyclic dehydrogenation of Compound 18 using a Lewis acid and FeCl3 as an oxidizing agent.

Synthesis Example 4: Synthesis of Compound TUD-11

Compound TUD-11 was synthesized according to the following scheme.

First, 1,3,5-triethynylbenzene (20) was synthesized in a yield of 82% in two steps by Sonogashira coupling of 1,3,5-tribromobenzene and trimethylsilylacetylene and subsequent removal of a TMS protecting group. Next, 3,4-bis(4-(anthracen-9-yl)phenyl)-2,5-diphenylcyclopenta-2,4-dien-1-one (22) was obtained in a yield of 65% by Knoevenagel condensation reaction between dione 6 and 1,3-diphenylpropan-2-one (21). Then, oligophenylene 23 was obtained in a yield of 83% through Diels-Alder cycloaddition of Compounds 20 and 22. Additionally, Precursor 24 was obtained in a yield of 89% by Diels-Alder cycloaddition of compound 23 and N-octylmaleimide (1) Finally, Compound TUD-11 was obtained in a yield of 93% through Scholl reaction of Precursor 24.

Comparative Synthesis Example 1: Synthesis of Compound 5

Graphene quantum dots having no substituent R in Synthesis Example 1 were synthesized.

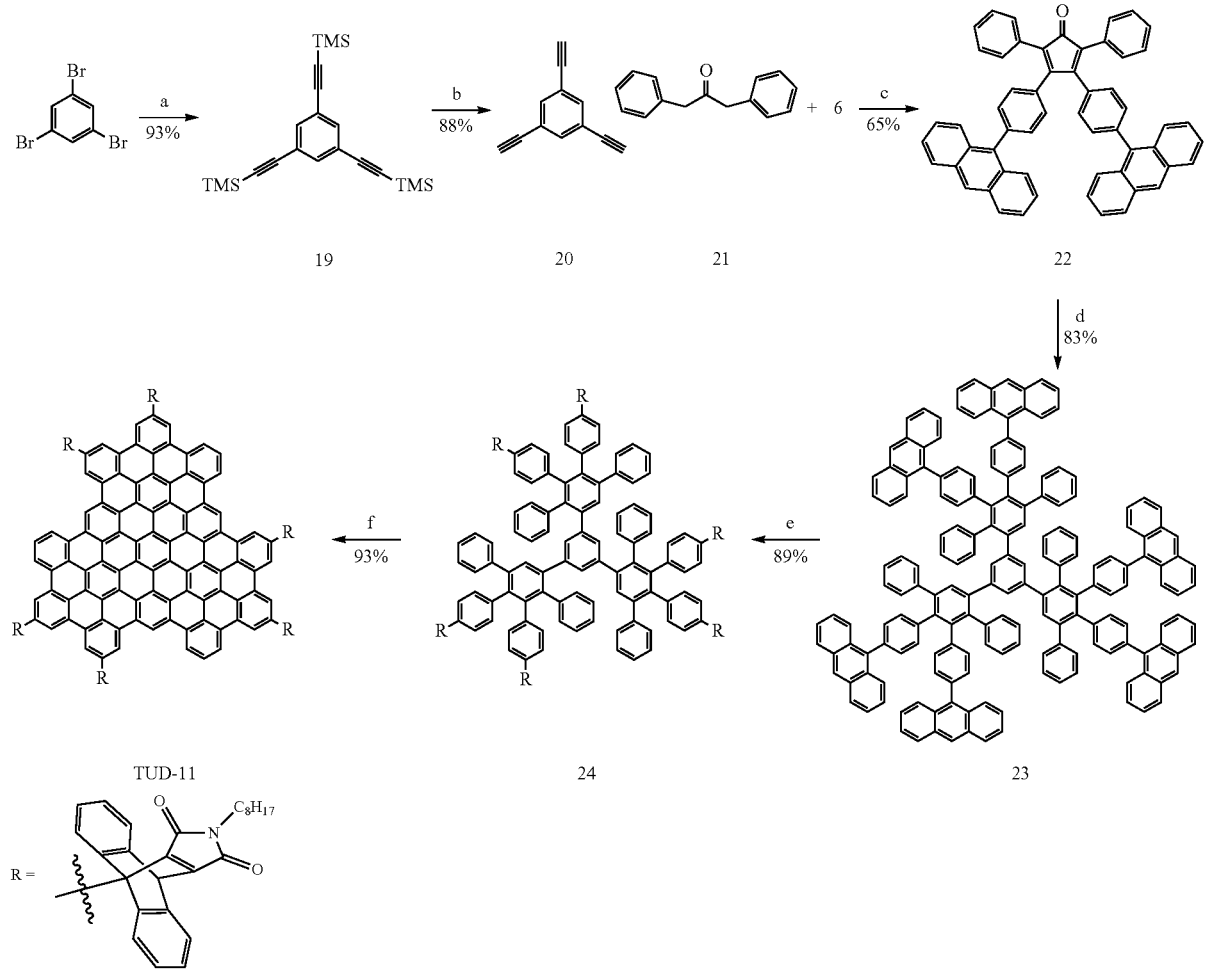

Preparation of Luminescent Solution and Luminescent Film

Example 1

(1) Preparation of Luminescent Solution

The Compound TUD-8 obtained in Synthesis Example 1 was dissolved in a THF solvent at a concentration of $10^{-5}$ M to prepare a luminescent solution (2) Preparation of Luminescent Film 1 wt % of the Compound TUD-8 obtained in Synthesis Example 1 was dissolved in THF and applied onto a glass substrate by spin coating to prepare a luminescent film.

Example 2

A luminescent solution and a luminescent film were prepared in the same manner as in Example 1, except that the Compound TUD-9 obtained in Synthesis Example 2 was used as a light-emitting material.

Example 3

A luminescent solution and a luminescent film were prepared in the same manner as in Example 1, except that the Compound TUD-10 obtained in Synthesis Example 3 was used as a light-emitting material.

Example 4

A luminescent solution and a luminescent film were prepared in the same manner as in Example 1, except that the Compound TUD-11 obtained in Synthesis Example 4 was used as a light-emitting material.

Comparative Example 1

A luminescent solution and a luminescent film were prepared in the same manner as in Example 1, except that the compound obtained in Comparative Synthesis Example 1 was used as a light-emitting material. However, since graphene quantum dots having no substituent did not dissolve well in a solution, it was difficult to prepare a luminescent film.

Evaluation Example 1: Evaluation of Luminescence Characteristics

Photoluminecscence (PL) spectra of the luminescent solutions and luminescent films of Examples 1 to 4 were measured using Spectrofluorometer F7000 (manufactured by Hitachi, Ltd) equipped with a xenon lamp. The PL spectra of the luminescent solutions and luminescent films of Examples 1 to 4 were measured at wavelengths of $\lambda_{ex}$=483 nm, 604 nm, 556 nm and 634 nm, respectively.

FIG. 1 is a graph illustrating the photoluminescence spectra for each wavelength of the luminescent solutions of Examples 1, 3, and 4 As shown in FIG. 1, it may be found that the water-soluble graphene quantum dots according to the Synthesis Examples can realize various colors in RGB regions depending on the size of the graphene quantum dots and exhibit excellent luminescence characteristics.

Figure 2:
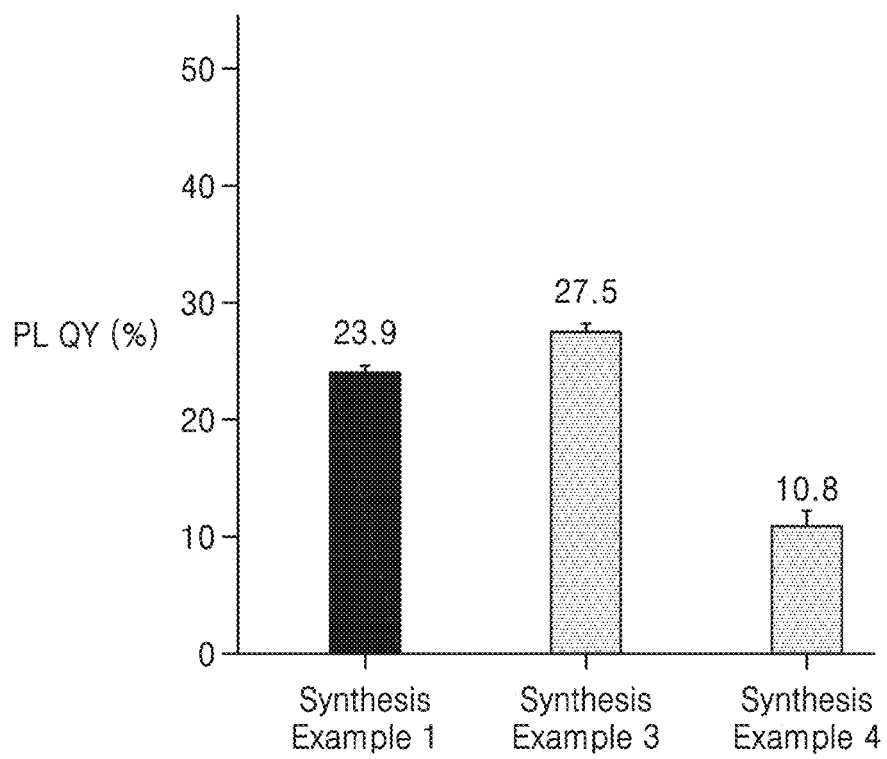
FIG. 2 illustrates the results of measuring the luminescence efficiency (photoluminescence quantum yield, PL QY) of the luminescent solutions of Examples 1, 3 and 4.
Figure 3:
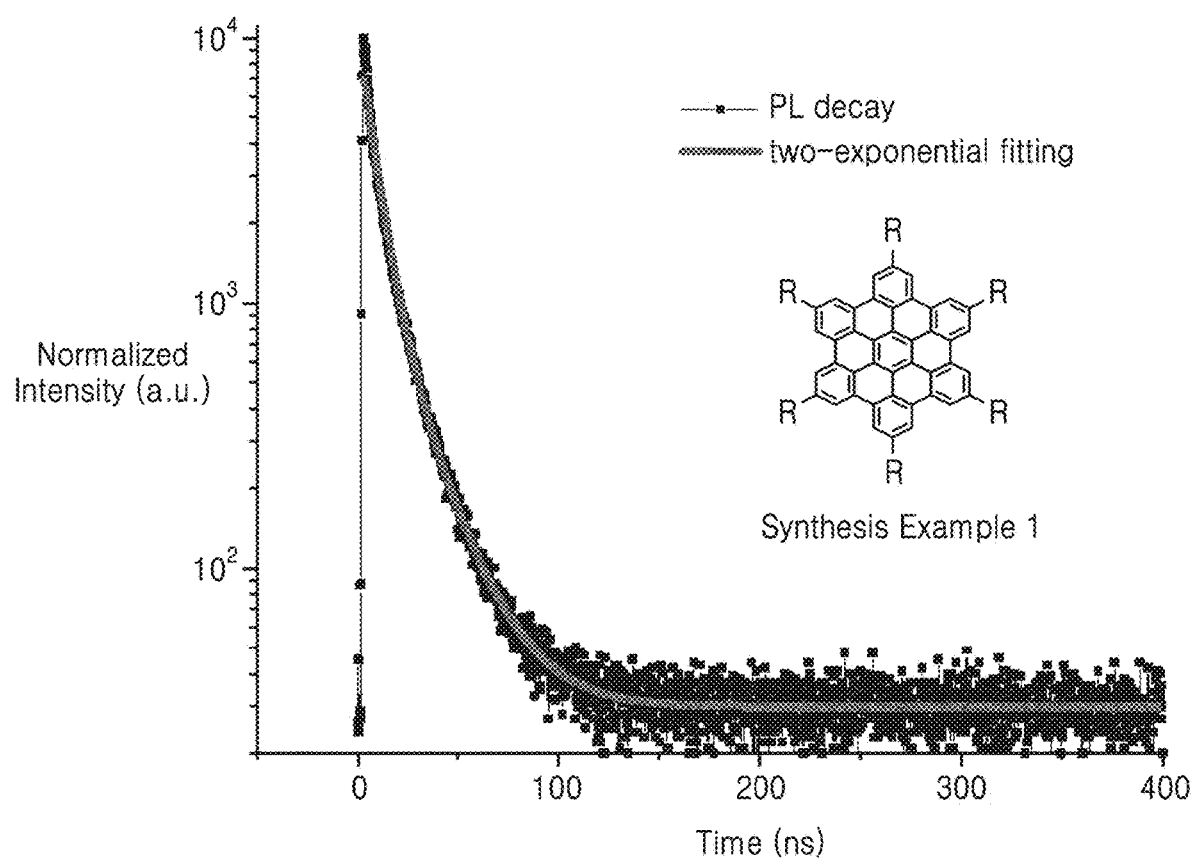
FIGS. 3 to 6 are graphs illustrating changes in emission intensity with time of the compounds used in Examples 1 to 4, respectively.
Figure 4:
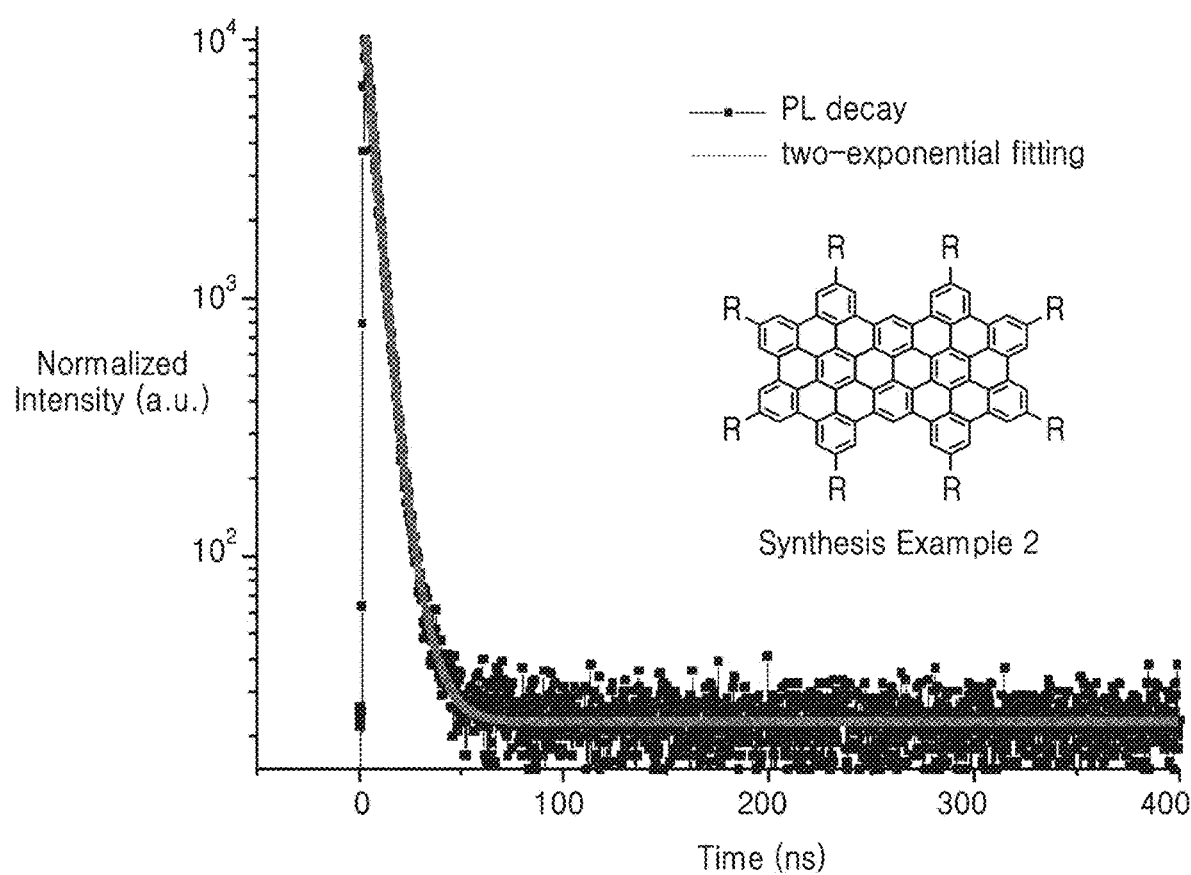
Figure 5:
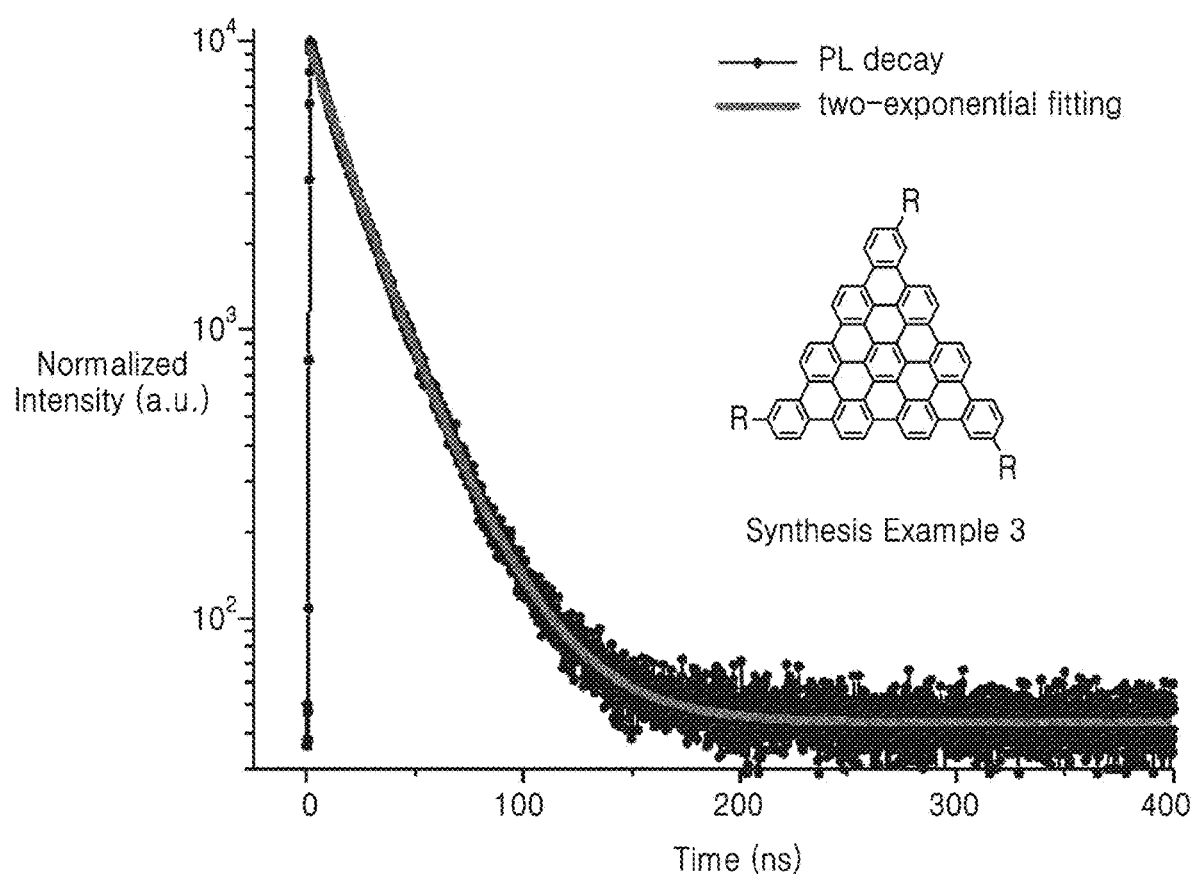
Figure 6:
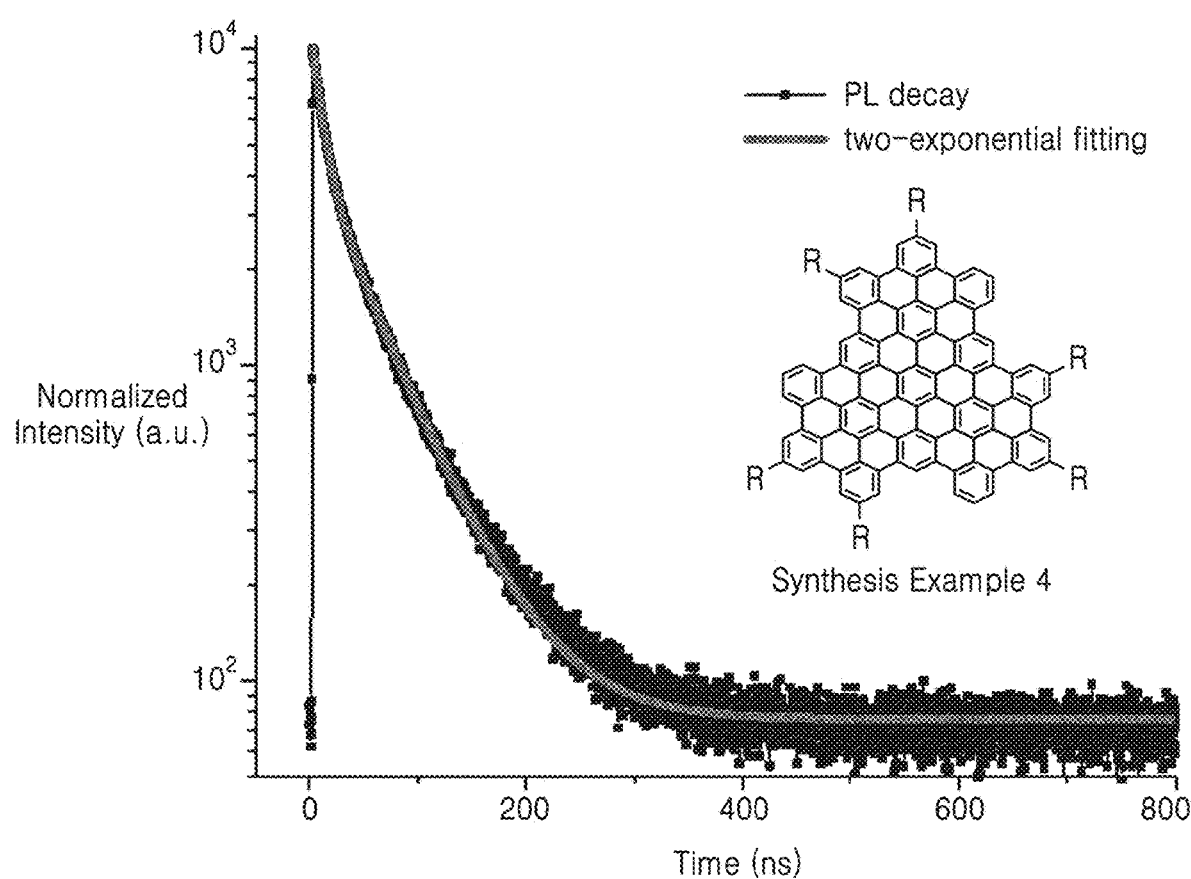

FIG. 2 illustrates the results of measuring the luminescence efficiency (photoluminescence quantum yield, PL QY) of the luminescent solutions of Examples 1, 3 and 4. As shown in FIG. 1, it may be found that the water-soluble graphene quantum dots according to the Synthesis Examples exhibit good luminescence efficiency even in a solution state.

FIGS. 3 to 6 are graphs illustrating the changes in emission intensity with time of the compounds used in Examples 1 to 4, respectively. In addition, when the reduction curve of the emission intensity according to time of each of FIGS. 3 to 6 is optimized using the following equation for obtaining the emission lifetime, the emission extinction time of the sample may be obtained.

$$y=y_0+A_1e^{-(x-x0)/t1}+A_2e^{-(x-x0)/t2}+\ldots$$

In this equation, $y_0$ represents a fluorescence intensity value in the absence of light, $x_0$ represents start time of emission detection, A represents emission intensity at time x, and t represents emission extinction time.

In the case of water-soluble graphene quantum dots according to Synthesis Examples, three-exponential decay curve fitting was performed for optimization. As a result, the emission extinction time (t) and emission retention rate (%) of the optimized curve are shown in Table 1 below. In Table 1 below, $\tau 1$ (ns) represents the emission extinction time and emission retention rate corresponding to the contribution by a graphene plate that is a core of the water-soluble graphene quantum dot, and $\tau 2$ (ns) represents the emission extinction time and emission retention rate corresponding to the contribution by a functional group that is an edge of the water-soluble graphene quantum dot. $\tau_{av}$ (ns) is average emission extinction time.

TABLE 1

|  | τ1 (ns) | τ2 (ns) | $\tau_{av}$ (ns) |
| --- | --- | --- | --- |
| Example 1 | 7.1 (85.2%) | 20.1 (14.8%) | 9.0 |
| Example 2 | 6.1 (100%) |  | 6.1 |
| Example 3 | 42.8 (100%) |  | 42.8 |
| Example 4 | 17.8 (66.0%) | 61.1 (34.0%) | 32.5 |

As shown in Table 1 above, in the water-soluble graphene quantum dots according to Synthesis Examples, it may be found that, during light emission, the contribution ratio by the graphene plate, which is a core of the quantum dot, is larger than the contribution ratio by the functional group, which is an edge of the quantum dot.

Example 5

A glass substrate provided with an indium tin oxide (ITO) electrode (first electrode, anode) having a thickness of 1500 Å was washed with distilled water and ultrasonic waves. After the substrate was washed with distilled water, the substrate was ultrasonically washed with a solvent such as isopropyl, alcohol, acetone or methanol, dried, and then transferred to a plasma cleaner. Then, the substrate was cleaned for 5 minutes using oxygen plasma, and then transferred to a vacuum deposition machine.

After Compound HT3 and Compound HT-D2 were co-deposited on the ITO electrode of the glass substrate to form a hole injection layer having a thickness of 100 Å, Compound HT3 was deposited on the hole injection layer to form a hole transport layer having a thickness of 1300 Å, and mCP was deposited on the hole transport layer to form an electron blocking layer having a thickness of 100 Å, thereby forming a hole transport region.

Compound 1 (host) and FIr6 (dopant, 10 wt %) were co-deposited on the hole transport region to form an emission layer having a thickness of 400 Å.

After BCP was vacuum-deposited on the emission layer to form a hole blocking layer having a thickness of 100 Å and Compound ET3 and Liq were vacuum-deposited together on the hole blocking layer to form an electron transport layer having a thickness of 300 Å, Liq was deposited on the electron transport layer to form an electron injection layer having a thickness of 10 Å, and an Al second electrode (cathode) having a thickness of 1200 Å was formed on the electron injection layer, thereby manufacturing an organic light-emitting device.

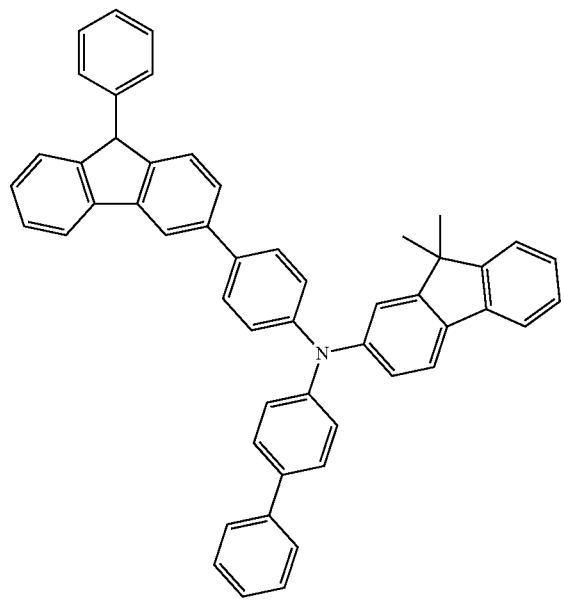

HT3

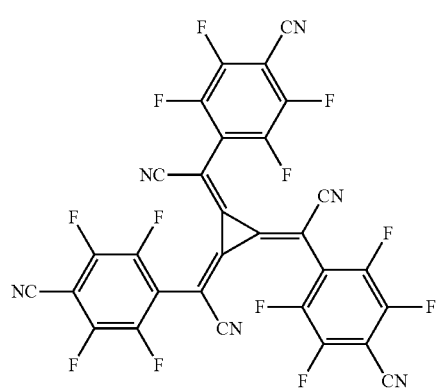

HT-D2

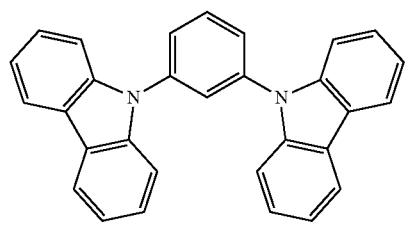

mCP

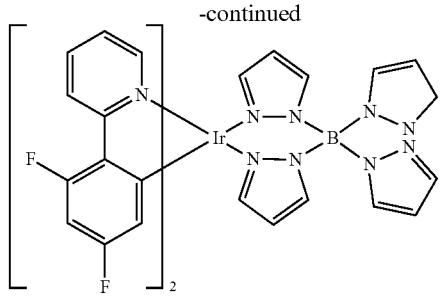

FIr6

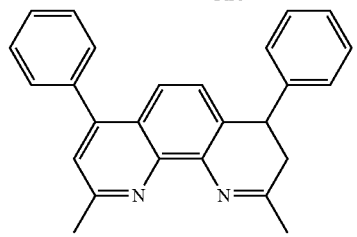

BCP

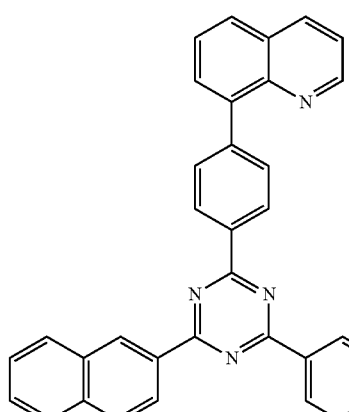

ET3

Example 6

An organic light-emitting device was manufactured in the same manner as in Example 5, except that Compound 2 was used instead of Compound 1 as a host when the emission layer was formed.

Example 7

An organic light-emitting device was manufactured in the same manner as in Example 5, except that Compound 3 was used instead of Compound 1 as a host when the emission layer was formed.

Example 8

An organic light-emitting device was manufactured in the same manner as in Example 5, except that Compound 4 was used instead of Compound 1 as a host when the emission layer was formed.

Comparative Example 2

An organic light-emitting device was manufactured in the same manner as in Example 5, except that Compound 5 was used instead of Compound 1 as a host when the emission layer was formed.

Soluble graphene quantum dots according to an embodiment may have an anthracenyl N-alkyl maleimide functional group at the edge thereof, thereby providing improved solubility and/or exhibiting improved emission characteristics.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A soluble graphene quantum dot comprising:
an anthracenyl N-alkyl maleimide functional group at an edge thereof,
wherein the soluble graphene quantum dot is represented by at least one of Formulas 1 to 8, <Formula 1>

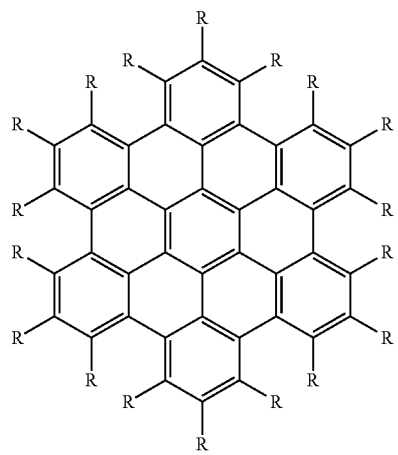

<Formula 2>

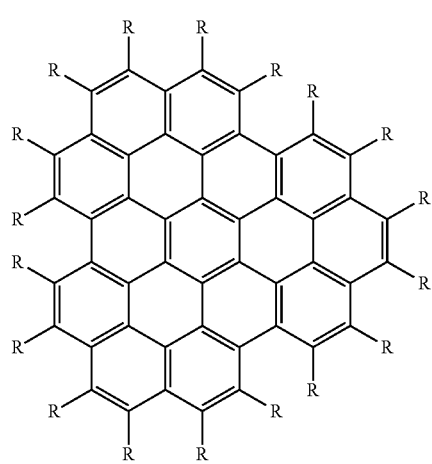

<Formula 3>

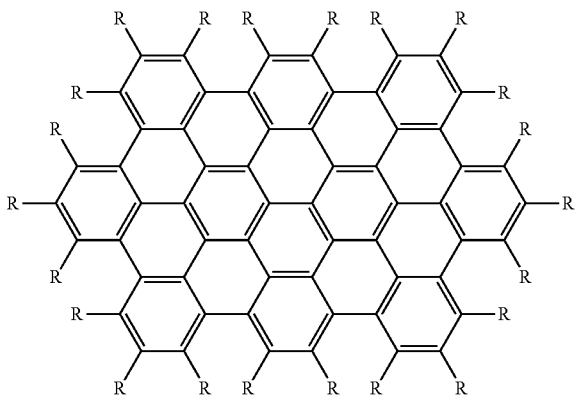

<Formula 4>

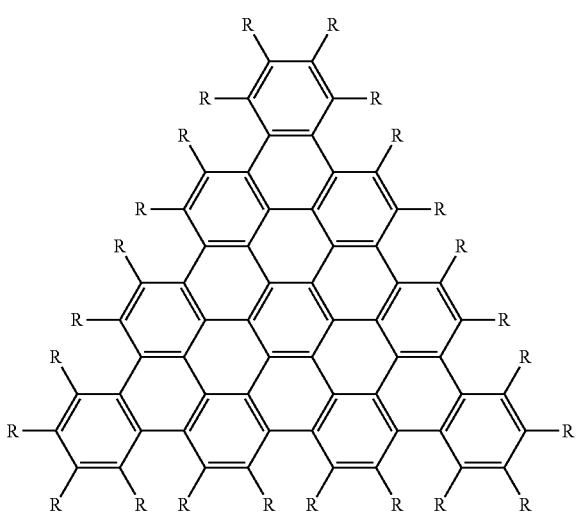

<Formula 5>

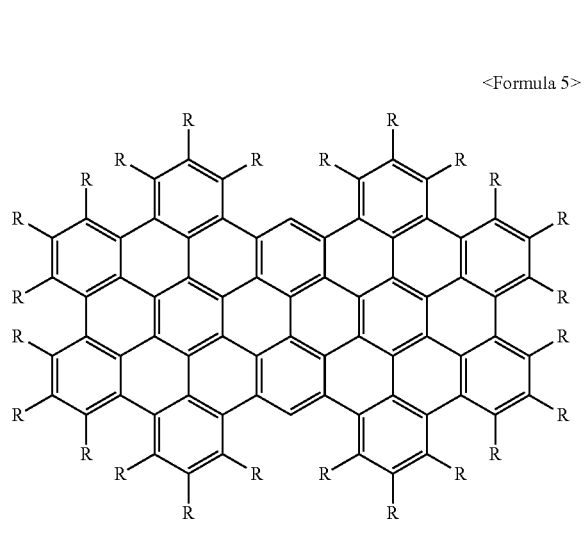

<Formula 6>

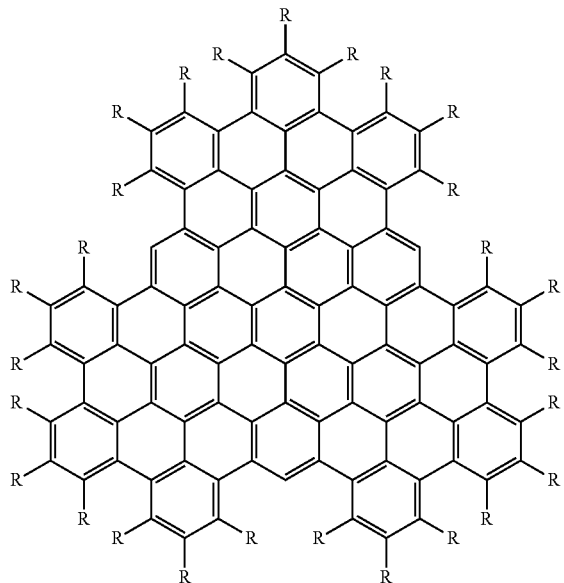

<Formula 7>

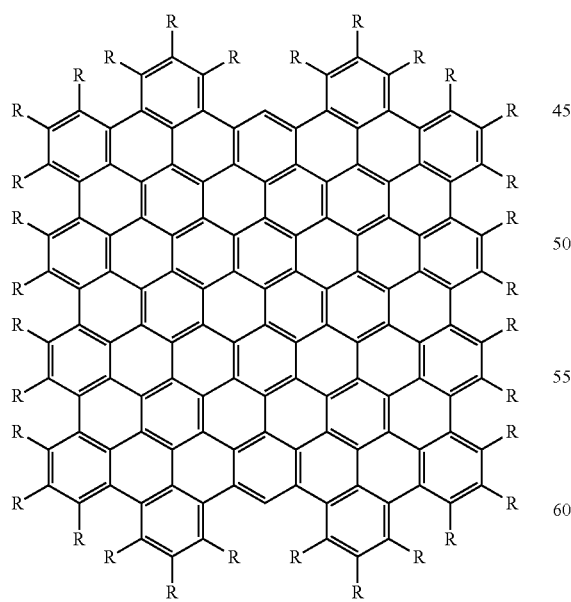

<Formula 8>

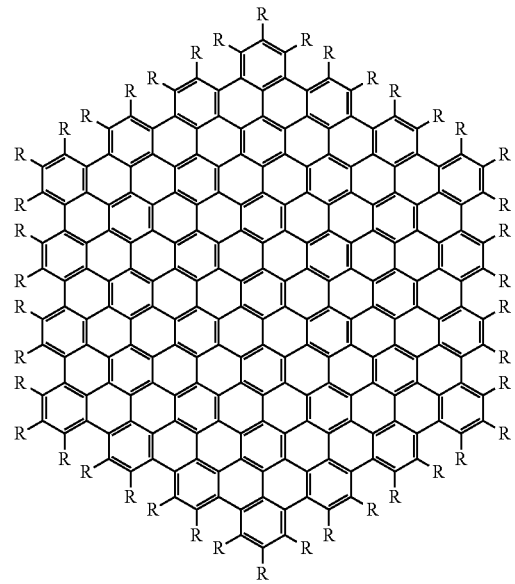

wherein, in Formulas 1 to 8, among the Rs,
at least one R is the anthracenyl N-alkyl maleimide functional group, and other Rs are hydrogen atoms.

2. The soluble graphene quantum dot of claim 1,
wherein, in the anthracenyl N-alkyl maleimide functional group, a substituted or unsubstituted C1 to C20 alkyl group is bonded to N.

3. The soluble graphene quantum dot of claim 1,
wherein the anthracenyl N-alkyl maleimide functional group is represented by a Formula below:

R = 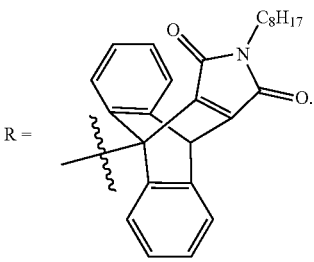

4. The soluble graphene quantum dot of claim 1,
wherein, in the anthracenyl N-alkyl maleimide functional group, at least one hydrogen atom is independently substituted with —F (fluoro group), an unsubstituted $C_1$-$C_{10}$ alkyl group, an unsubstituted $C_6$-$C_{10}$ aryl group, a fluoro group-substituted $C_1$-$C_{10}$ alkyl group, or a fluoro group-substituted $C_6$-$C_{10}$ aryl group.

5. The soluble graphene quantum dot of claim 1,
wherein the soluble graphene quantum dot has a graphene core plane having a carbon number of 24 to 300 and a width-length ratio of less than about 1:3.

6. The soluble graphene quantum dot of claim 1,
wherein the soluble graphene quantum dot has at least one of graphene core planes having carbon numbers of 42, 48, 60, 72, 96, 132 and 222.

7. The soluble graphene quantum dot of claim 1,
wherein the soluble graphene quantum dot is represented by at least one of Formulas 1a, 4a, 5a and 6a, <Formula 1a>

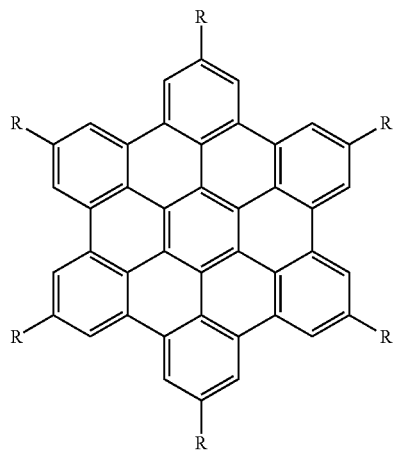

<Formula 4a>

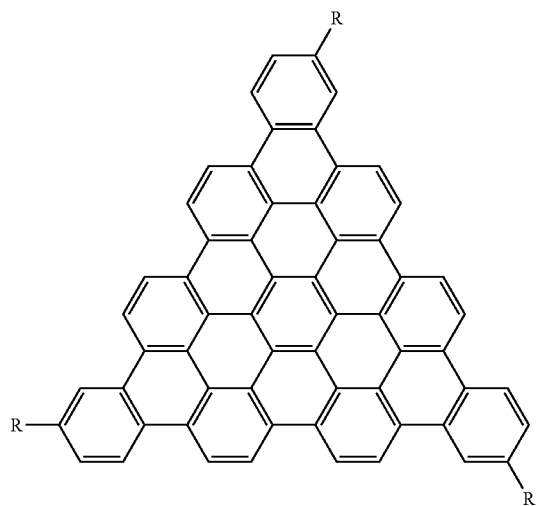

<Formula 5a>

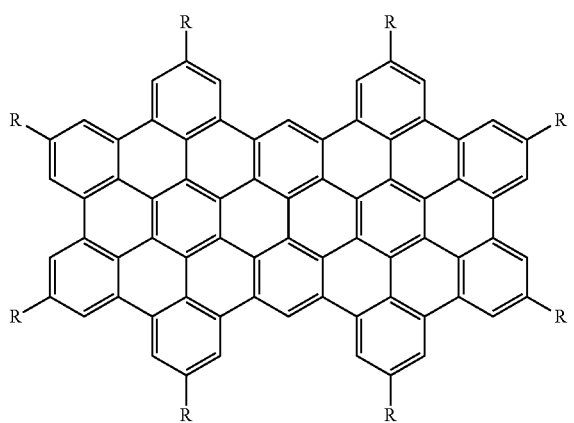

<Formula 6a>

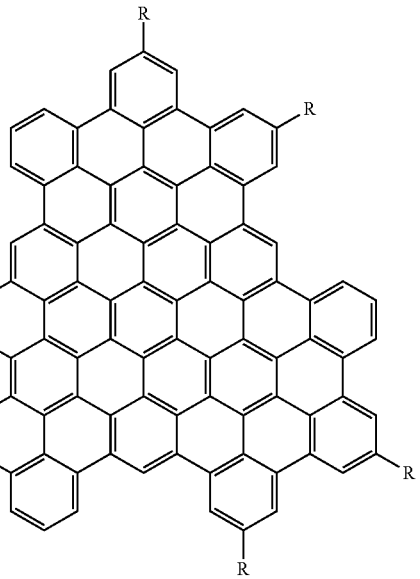

wherein, in Formulas 1a, 4a, 5a, and 6a, each R is the anthracenyl N-alkyl maleimide functional group.

8. The soluble graphene quantum dot of claim 7, wherein each R is represented by a following Formula:

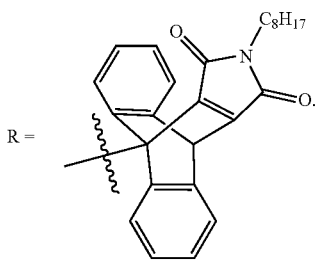

9. A light-emitting material comprising:
at least one of the soluble graphene quantum dot of claim 1.

10. The light-emitting material of claim 9, wherein the light-emitting material is in a solid state or a solution state.

11. The light-emitting material of claim 9, wherein the light-emitting material has emission characteristics of a wavelength in a range of about 350 nm to about 650 nm.

12. A light-emitting device comprising:
at least one of the soluble graphene quantum dot of claim 1.

13. An organic light-emitting device comprising:
a first electrode;
a second electrode; and
an organic layer including an emission layer between the first electrode and the second electrode,
wherein the organic layer includes the soluble graphene quantum dot of claim 1.

14. The organic light-emitting device of claim 13, wherein the first electrode is an anode,
the second electrode is a cathode, and
the organic layer includes, i) a hole transport region interposed between the first electrode and the emission layer and including at least one of a hole injection layer, a hole transport layer, and an electron blocking layer, and ii) an electron transport region interposed between the emission layer and the second electrode and including at least one of a hole blocking layer, an electron transport layer, and an electron injection layer.

15. The organic light-emitting device of claim 13, wherein the emission layer includes the soluble graphene quantum dot.

16. The organic light-emitting device of claim 15, wherein the emission layer has emission characteristics of a wavelength in a range of about 350 nm to about 650 nm.

\* \* \* \* \*